US012652800B2

(12) United States Patent
Lee et al.

(10) Patent No.: US 12,652,800 B2
(45) Date of Patent: Jun. 9, 2026

(54) VERTICAL MEMORY DEVICE

(71) Applicant: SAMSUNG ELECTRONICS CO., LTD., Suwon-si (KR)

(72) Inventors: Sohyeon Lee, Suwon-si (KR); Seahoon Lee, Suwon-si (KR); Jaeduk Lee, Suwon-si (KR); Tackhwi Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 434 days.

(21) Appl. No.: 18/232,568

(22) Filed: Aug. 10, 2023

(65) Prior Publication Data

US 2024/0121952 A1 Apr. 11, 2024

(30) Foreign Application Priority Data

Oct. 5, 2022 (KR) ......................... 10-2022-0127003

(51) Int. Cl.
*H10B 43/10* (2023.01)
*H10B 41/10* (2023.01)
*H10B 41/27* (2023.01)
*H10B 43/20* (2023.01)
(Continued)

(52) U.S. Cl.
CPC ............. *H10B 43/20* (2023.02); *H10B 41/10* (2023.02); *H10B 41/27* (2023.02); *H10B 43/10* (2023.02); *H10B 43/27* (2023.02); *H10B 43/30* (2023.02)

(58) Field of Classification Search
CPC ........ H10B 43/20; H10B 41/10; H10B 41/27; H10B 43/10; H10B 43/27; H10B 43/30; H10B 43/40; H10B 43/50; H10B 41/50
See application file for complete search history.

(56) References Cited

U.S. PATENT DOCUMENTS 9,263,461 B2 2/2016 Tanzawa
9,515,087 B2 * 12/2016 Son ........................ G11C 5/025
10,014,058 B2 * 7/2018 Lee ........................ G11C 16/16
(Continued)

FOREIGN PATENT DOCUMENTS

JP 2007-201240 A 8/2007

OTHER PUBLICATIONS

Communication issued Mar. 29, 2026 by the Korean Ministry of Intellectual Property for KR Patent Application No. 10-2022-0127003.

*Primary Examiner* — Eduardo A Rodela
(74) *Attorney, Agent, or Firm* — Sughrue Mion, PLLC

(57) ABSTRACT

A vertical memory device includes a substrate, first and second sub-semiconductor patterns, first and second common source contacts, and first and second cell structures. The substrate includes a first region and a second region having a same length as the first region in a first direction, the first region having a first width in a second direction perpendicular to the first direction, and the second region having a second width in the second direction that is less than the first width. The first sub-semiconductor pattern covers the first region, and a portion of the first sub-semiconductor pattern has a first thickness. The second sub-semiconductor pattern covers the second region and has a second thickness that is less than the first thickness. The first and second common source contacts are disposed on edges in the second direction of the first and second patterns, respectively.

20 Claims, 40 Drawing Sheets

(51) Int. Cl.
  *H10B 43/27*   (2023.01)
  *H10B 43/30*   (2023.01)

(56)               References Cited

U.S. PATENT DOCUMENTS

| 10,319,680 B1 | 6/2019 | Sel et al. |
| 10,483,207 B2 | 11/2019 | Watarai et al. |
| 10,964,711 B2 | 3/2021 | Murata et al. |
| 11,024,638 B2 * | 6/2021 | Shim ..................... H10B 41/41 |
| 11,361,816 B2 * | 6/2022 | Cui .................... G11C 11/4085 |
| 2017/0084623 A1 * | 3/2017 | Sharangpani .......... H10B 41/27 |
| 2018/0350844 A1 | 12/2018 | Makiyama et al. |
| 2019/0172838 A1 * | 6/2019 | Jo .......................... H10B 43/27 |
| 2021/0028182 A1 | 1/2021 | Lee |
| 2021/0082809 A1 | 3/2021 | Kim et al. |
| 2021/0408034 A1 * | 12/2021 | Lee ........................ H10B 41/27 |
| 2022/0108963 A1 | 4/2022 | Hwang et al. |
| 2023/0171957 A1 * | 6/2023 | Zhou ...................... H10B 41/27 |
| | | 257/314 |
| 2024/0244844 A1 * | 7/2024 | Sondhi ................... H10B 43/27 |
| 2025/0040137 A1 * | 1/2025 | Shin ....................... H10B 43/27 |
| 2025/0118686 A1 * | 4/2025 | Jung ...................... H10B 43/50 |

* cited by examiner

FIG. 1
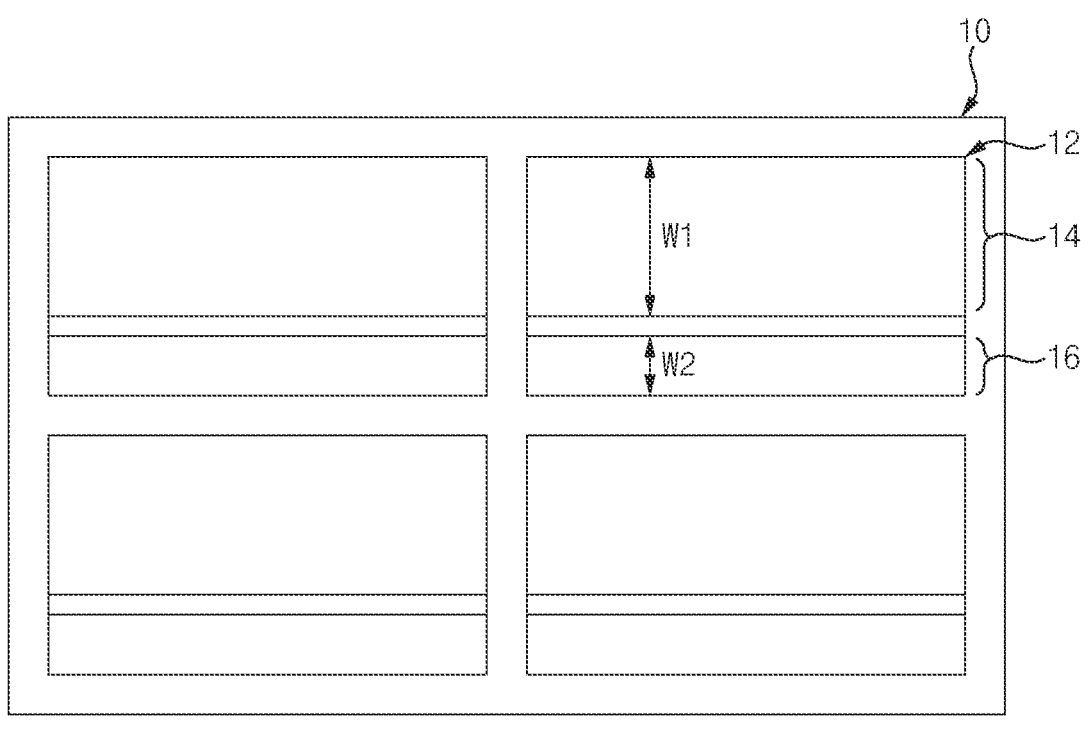
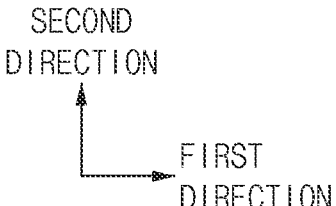

FIG. 5

FIG. 6
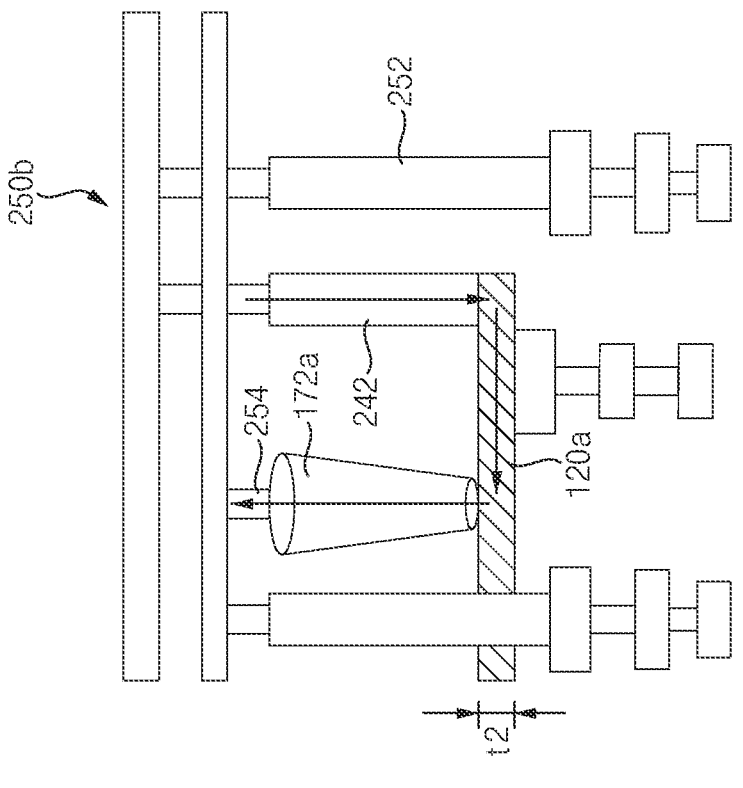
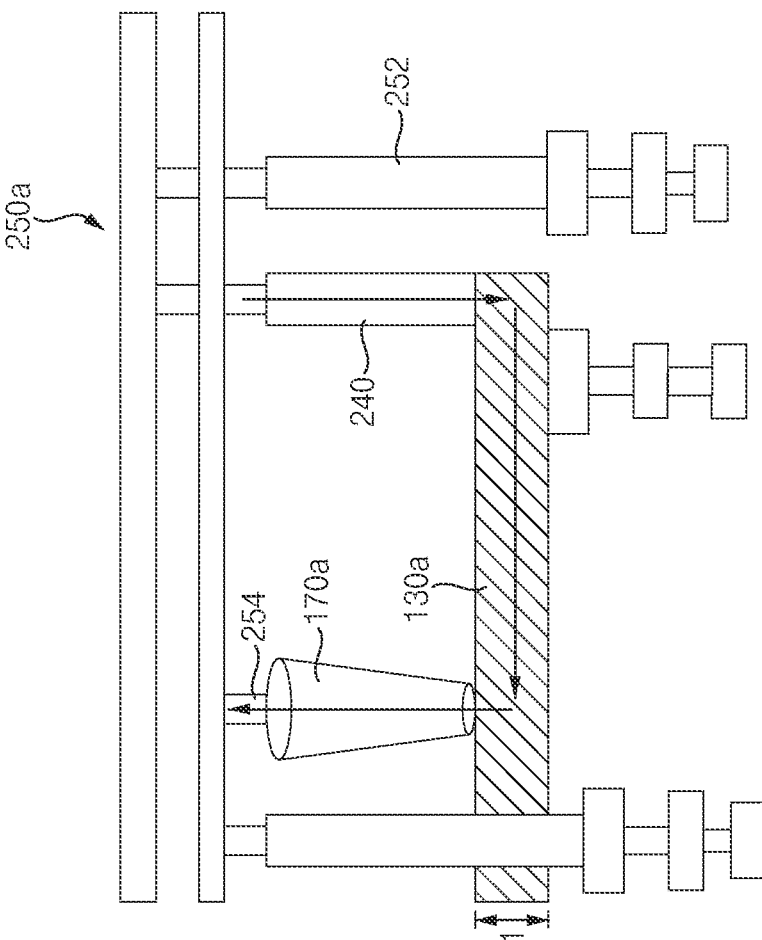

FIG. 11
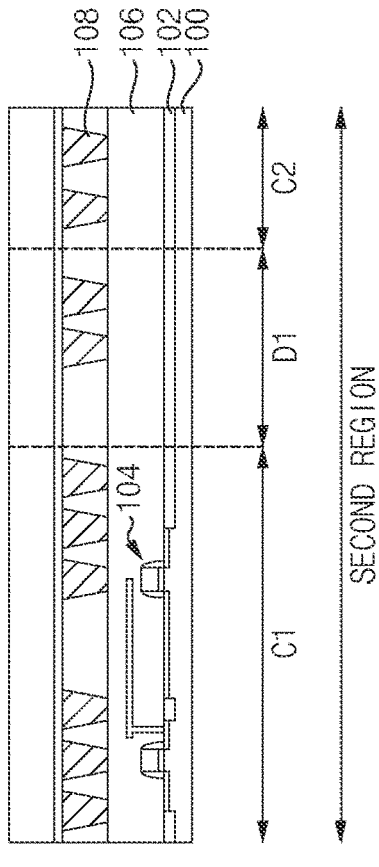
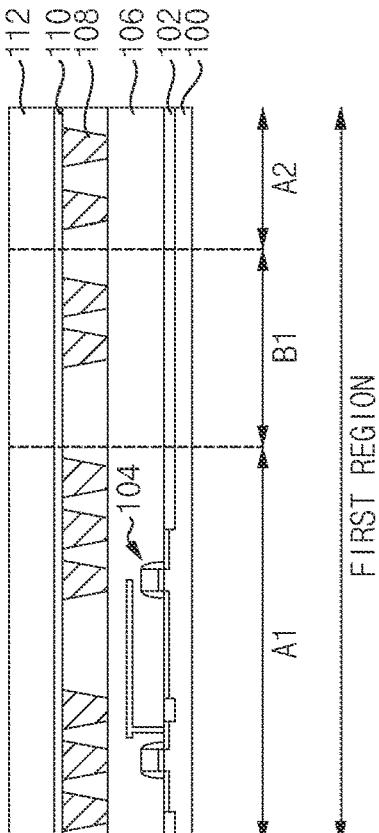

FIG. 13
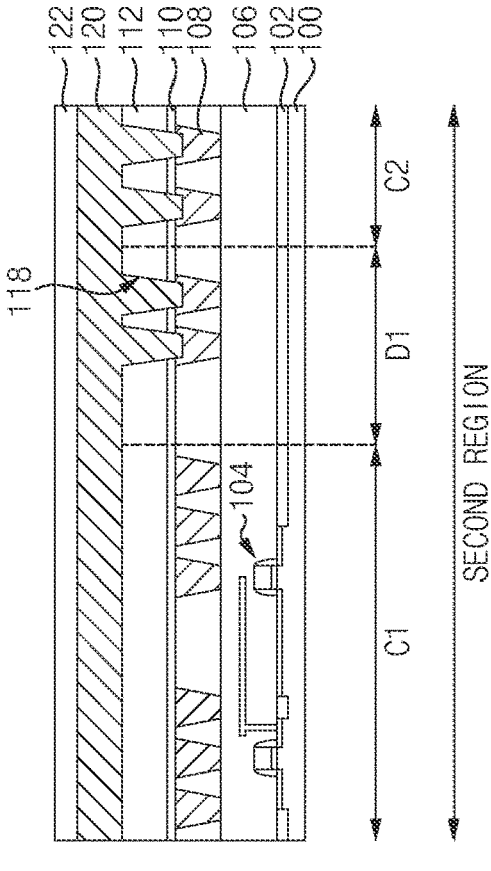
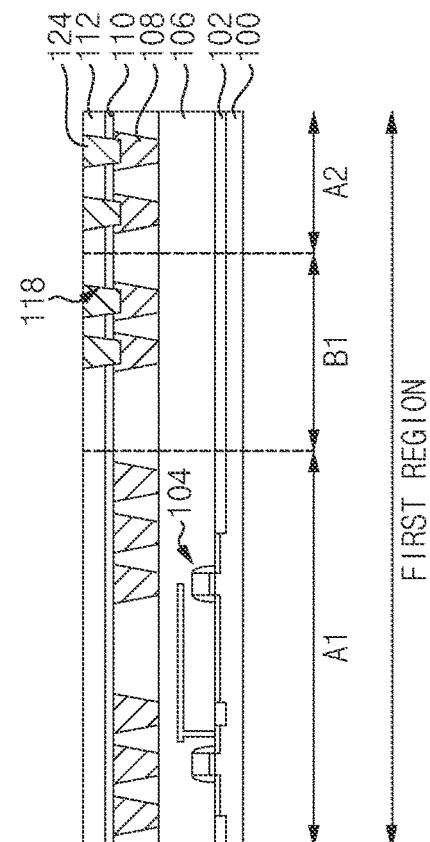

F I G .  1 4
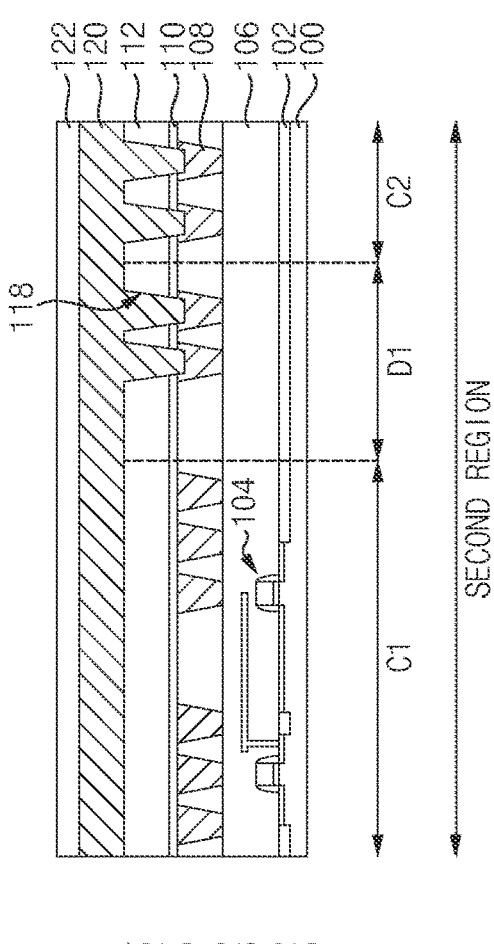
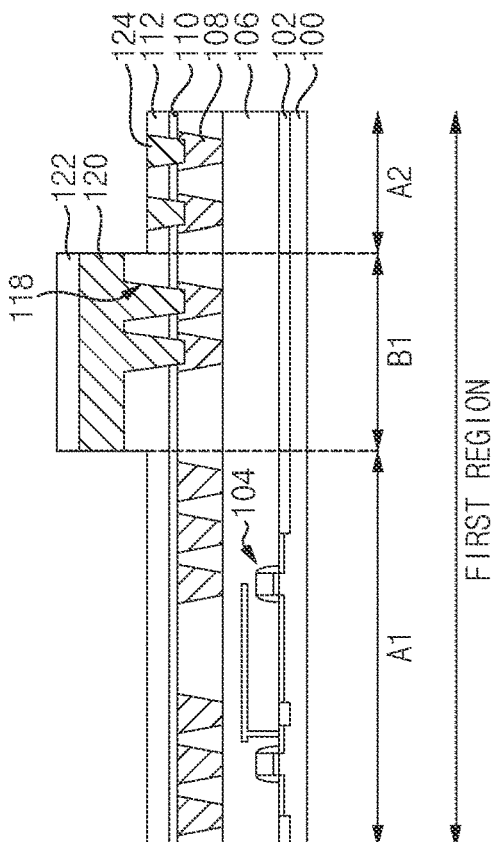

FIG. 16
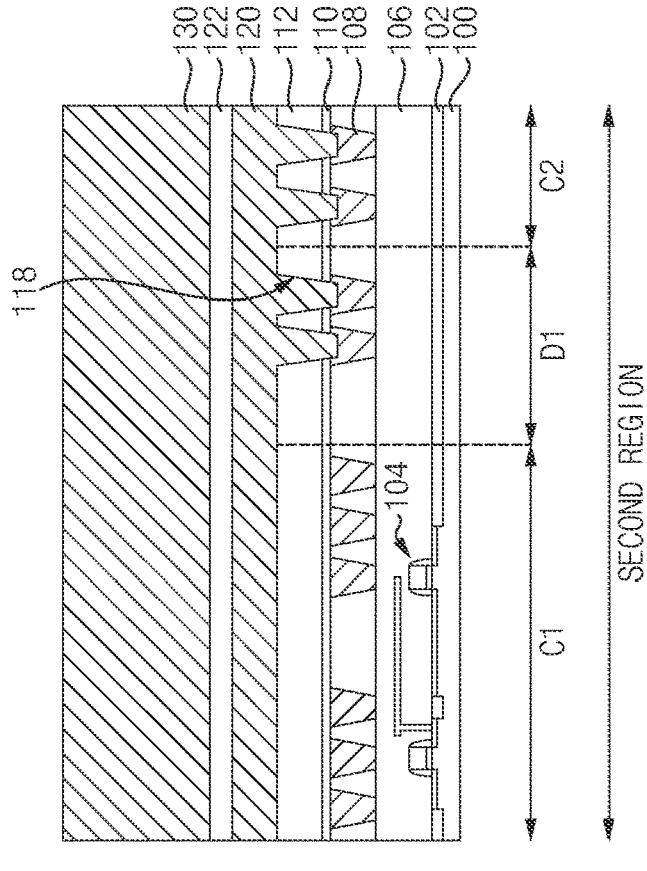
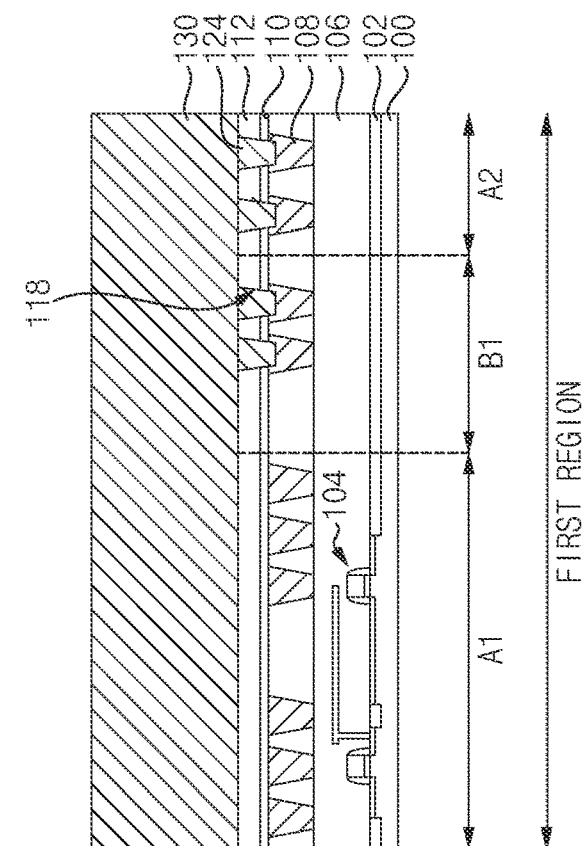

F I G. 22
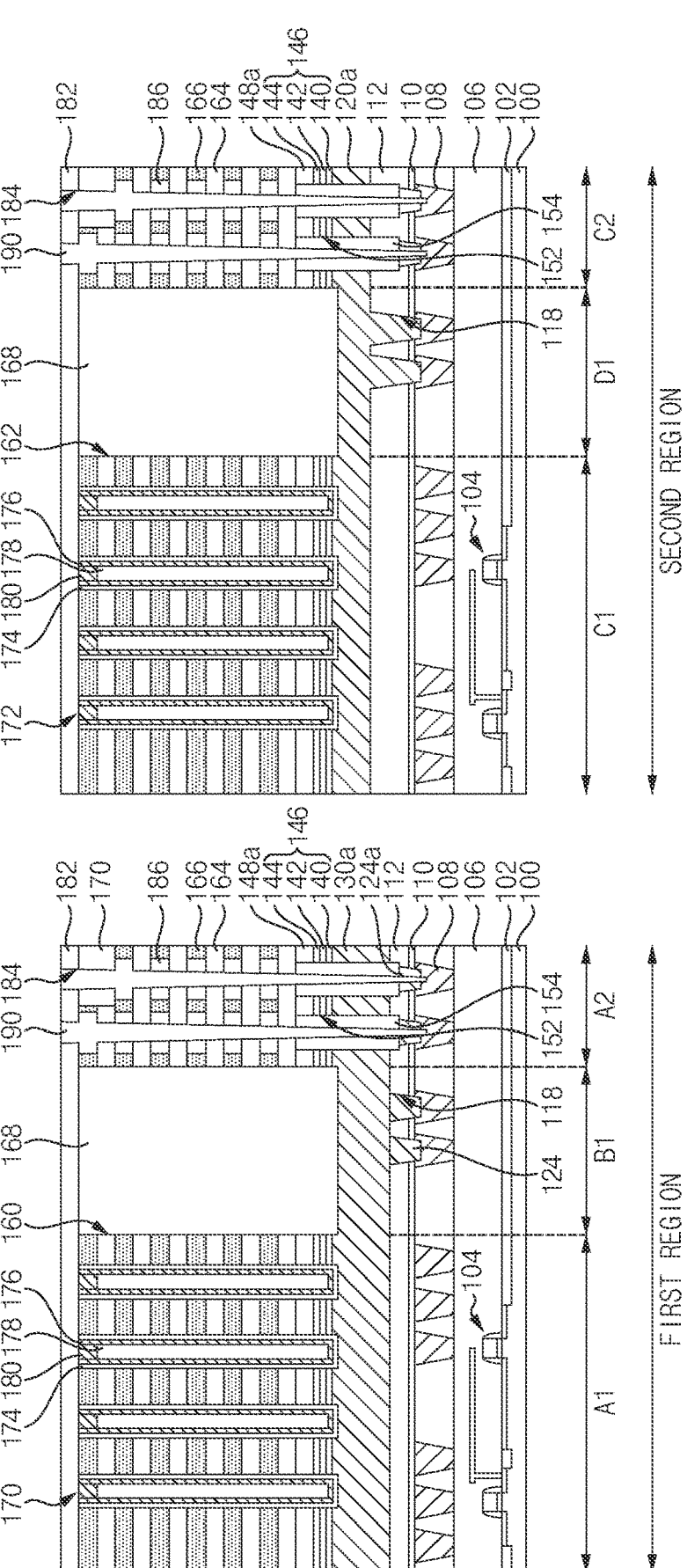

FIG. 26
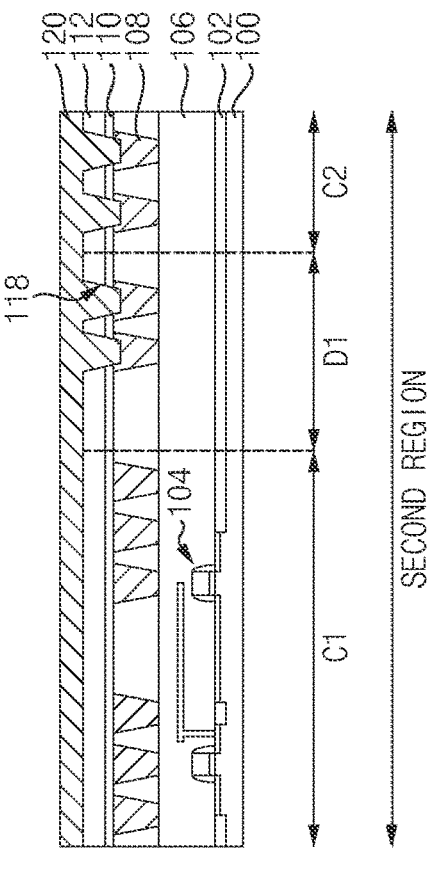
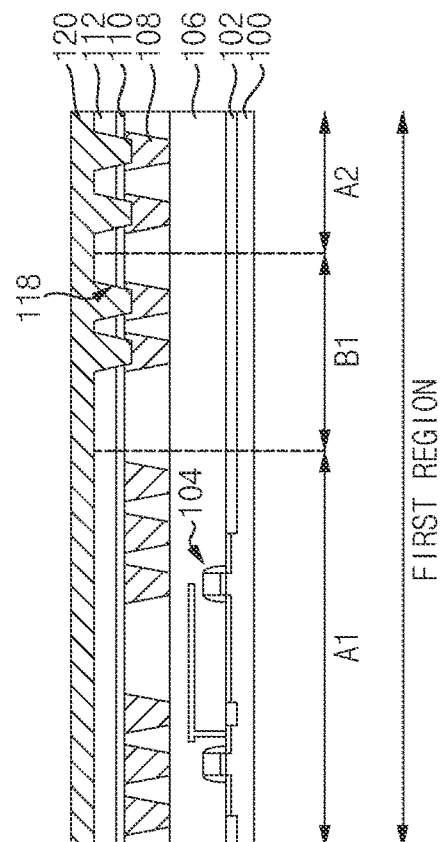

FIG. 27
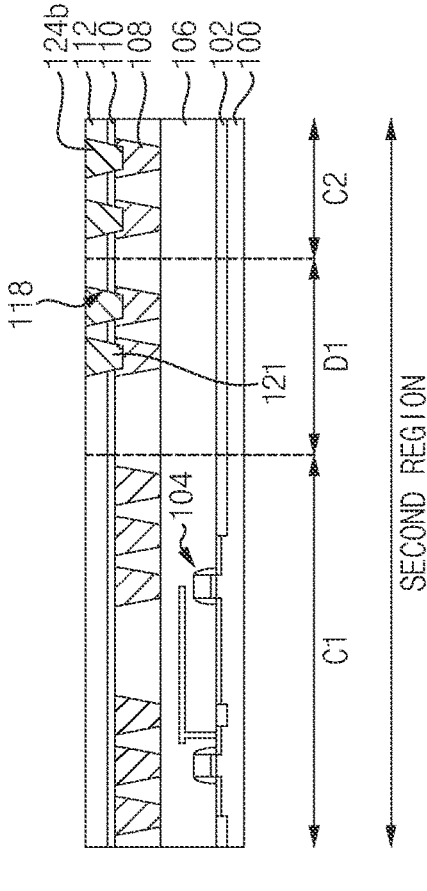
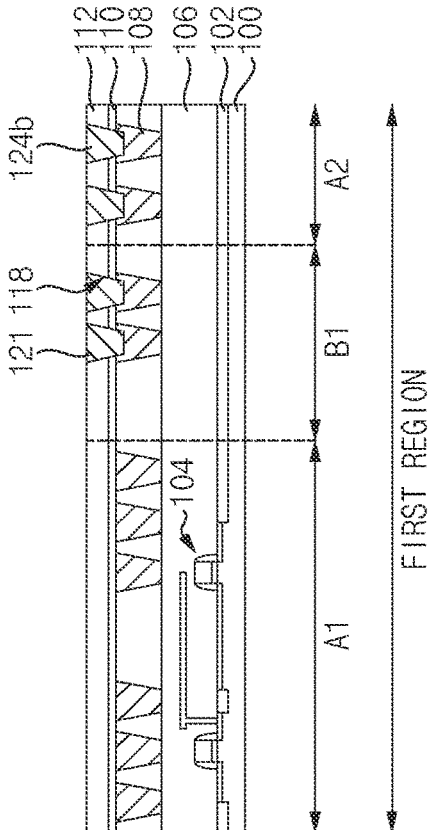

FIG. 28
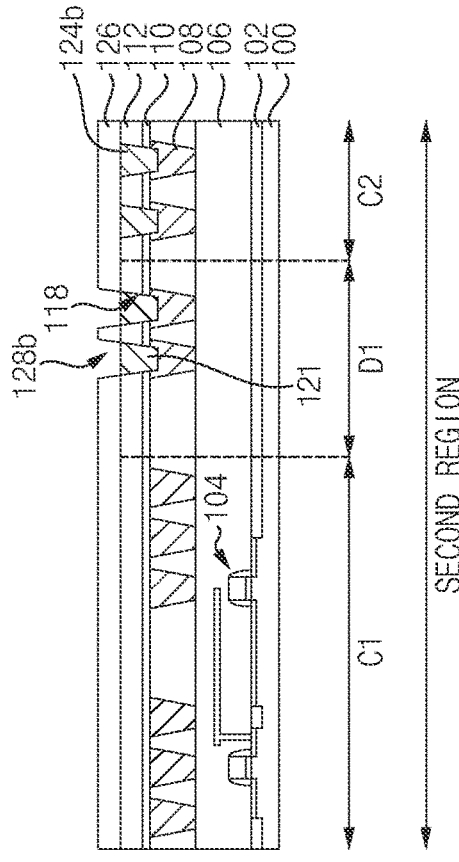
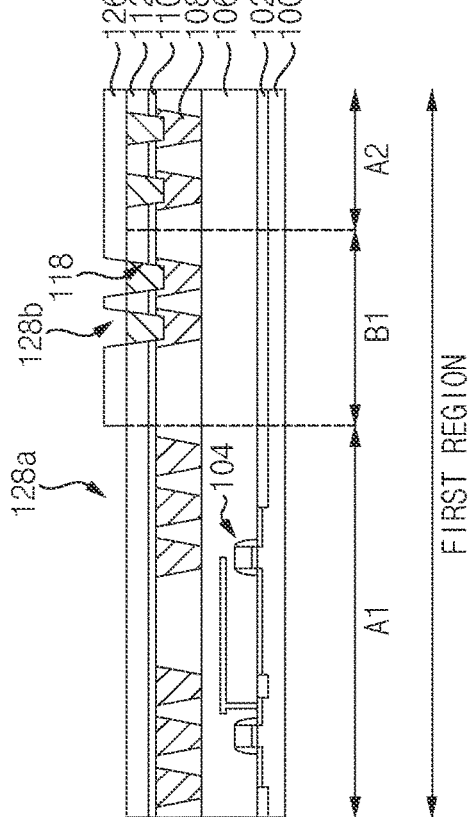

FIG. 29
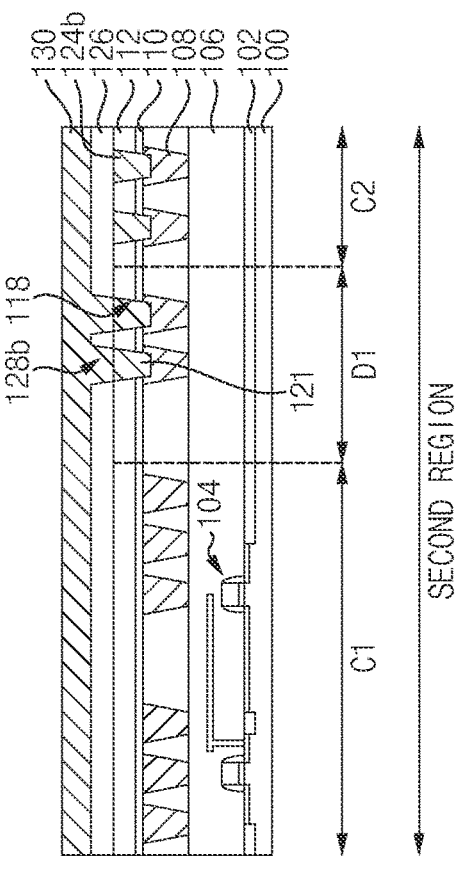
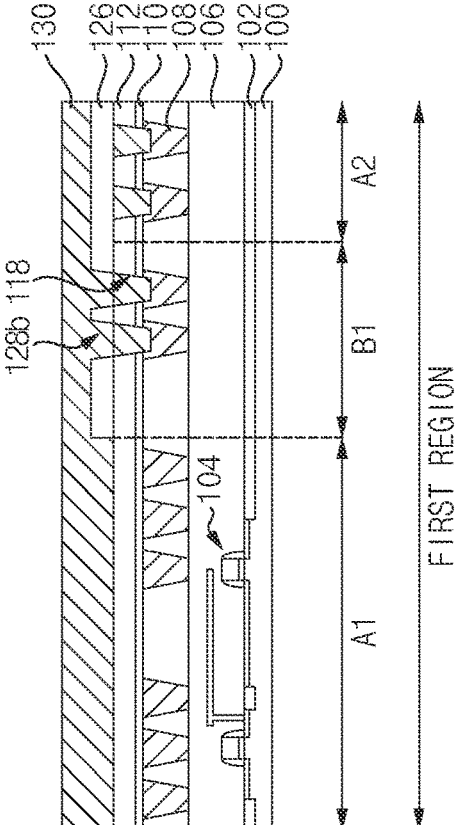

FIG. 31
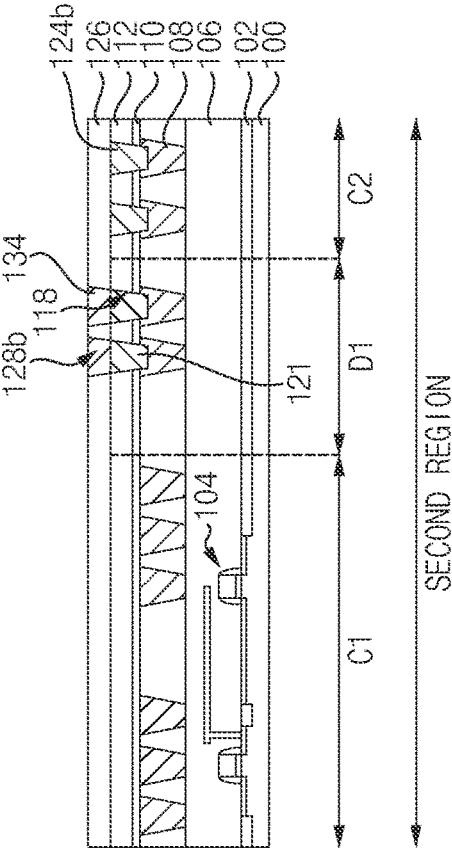
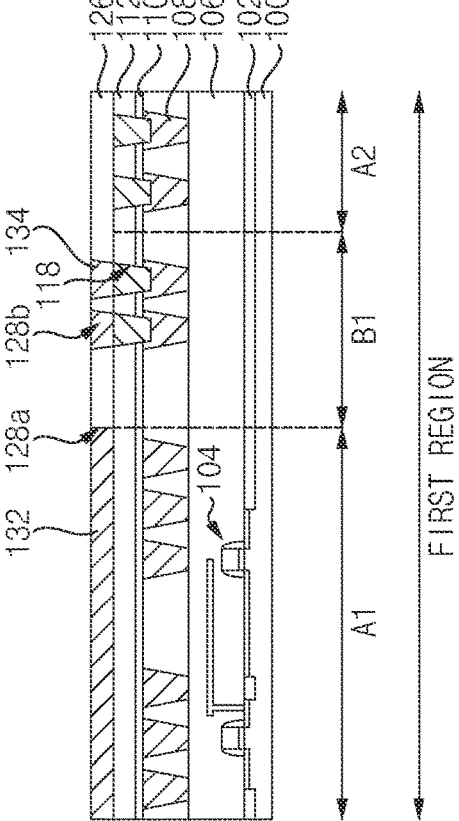

SECOND DIRECTION

FIRST DIRECTION

FIG. 38

VERTICAL MEMORY DEVICE

CROSS-REFERENCE TO RELATED APPLICATION

This application is based on and claims priority under 35 USC § 119 to Korean Patent Application No. 10-2022-0127003 filed on Oct. 5, 2022 in the Korean Intellectual Property Office, the disclosure of which being incorporated by reference herein in its entirety.

BACKGROUND

Example embodiments of the present disclosure relate to a vertical memory device.

Recently, a vertical memory device having a structure in which memory cells are vertically stacked has been developed. In the vertical memory device, a chip region may include a plurality of MAT regions. Each of the MAT regions may include a plurality of regions having different widths. The memory cells may be formed on each of the regions. It may not be easy to transfer electrical signals noise-free to memory cells formed in the each of regions.

SUMMARY

It is an aspect to provide a vertical memory device having excellent electrical characteristics.

According to an aspect of one or more example embodiments, there is provided a vertical memory device. The vertical memory device may include a substrate including a first region and a second region having a same length as the first region in a first direction, the first region having a first width in a second direction perpendicular to the first direction, and the second region having a second width in the second direction that is less than the first width; a first sub-semiconductor pattern covering the first region, the first sub-semiconductor pattern being spaced apart from an upper surface of the substrate, and at least a portion of the first sub-semiconductor pattern having a first thickness; a second sub-semiconductor pattern covering the second region, the second sub-semiconductor pattern being spaced apart from the upper surface of the substrate, and the second sub-semiconductor pattern having a second thickness that is less than the first thickness; a plurality of first common source contacts disposed on edges in the second direction of the first sub-semiconductor pattern; a plurality of second common source contacts disposed on edges in the second direction of the second sub-semiconductor pattern; a plurality of first cell structures on the first sub-semiconductor pattern; and a plurality of second cell structures on the second sub-semiconductor pattern.

According to another aspect of one or more example embodiments, there is provided a vertical memory device. The vertical memory device may include a substrate including a first region and a second region having a same length as the first region in a first direction, the first region having a first width in a second direction perpendicular to the first direction, and the second region having a second width in the second direction that is less than the first width; a first sub-semiconductor pattern covering the first region, the first sub-semiconductor pattern being spaced apart from an upper surface of the substrate, and the first sub-semiconductor pattern having a first sheet resistance; a second sub-semiconductor pattern covering the second region, the second sub-semiconductor pattern being spaced apart from the upper surface of the substrate, and the second sub-semiconductor pattern having a second sheet resistance that is greater than the first sheet resistance; a plurality of first common source contacts disposed on edges in the second direction of the first sub-semiconductor pattern; a plurality of second common source contacts disposed on edges in the second direction of the second sub-semiconductor pattern; a plurality of first cell structures on the first sub-semiconductor pattern; and a plurality of second cell structures on the second sub-semiconductor pattern.

According to yet another aspect of one or more example embodiments, there is provided a vertical memory device. The vertical memory device may include a substrate including a first region and a second region having a same length as the first region in a first direction, the first region having a first width in a second direction perpendicular to the first direction, and the second region having a second width in the second direction that is less than the first width; a plurality of circuit patterns on the substrate; a lower insulating interlayer covering the first region, the second region, and the plurality of circuit patterns; a first sub-semiconductor pattern on the lower insulating interlayer of the first region, and the first sub-semiconductor pattern covering the first region; a second sub-semiconductor pattern on the lower insulating interlayer of the first region, the second sub-semiconductor pattern covering the second region, and the second sub-semiconductor pattern having a second thickness different from a first thickness of the first sub-semiconductor pattern; a plurality of first common source contacts disposed on edges in the second direction of the first sub-semiconductor pattern, the plurality of first common source contacts applying electrical signals to the first sub-semiconductor pattern; a plurality of second common source contacts disposed on edges in the second direction of the second sub-semiconductor pattern, the plurality of second common source contacts applying electrical signals to the second sub-semiconductor pattern; a plurality of first cell structures on the first sub-semiconductor pattern, the plurality of first cell structures being electrically connected to the first sub-semiconductor pattern; and a plurality of second cell structures on the second sub-semiconductor pattern, the plurality of second cell structures being electrically connected to the second sub-semiconductor pattern, wherein an upper surface of the first sub-semiconductor pattern is coplanar with an upper surface of the second sub-semiconductor pattern, and wherein the upper surface of the first sub-semiconductor pattern and the upper surface of the second sub-semiconductor pattern are substantially flat.

BRIEF DESCRIPTION OF THE DRAWINGS

The above and other aspects will be more apparent from the following description taken in conjunction with the accompanying drawings, in which:

FIG. 1 is a plan view of a chip region of a vertical memory device according to example embodiments;

FIGS. 5 and 6 are a perspective view and a cross-sectional view illustrating a portion of a vertical memory device according to example embodiments;

FIGS. 11 to 25 are cross-sectional views illustrating a method of manufacturing a vertical memory device according to example embodiments;

FIGS. 26 to 30 are cross-sectional views illustrating a method of manufacturing a vertical memory device according to example embodiments;

FIGS. 31 to 33 are cross-sectional views illustrating a method of manufacturing a vertical memory device according to example embodiments;

FIG. 37 is a cross-sectional view illustrating sub-semiconductor patterns of a vertical memory device according to example embodiments;

FIG. 38 is a cross-sectional view illustrating sub-semiconductor patterns in a vertical memory device according to example embodiments.

DETAILED DESCRIPTION OF EMBODIMENTS

Hereinafter, various embodiments will be described in detail with reference to the accompanying drawings.

In the vertical memory device according to various example embodiments, a difference between a resistance of the first sub-semiconductor pattern and a resistance of the second sub-semiconductor pattern may be decreased. Accordingly, generation of signal noise applied to the first cell structures on the first sub-semiconductor pattern and the second cell structures on the second sub-semiconductor pattern may be decreased. Moreover, a timing skew may also be decreased.

Hereinafter, a direction parallel to the surface of a substrate is referred to as a first direction, and a direction parallel to the surface of the substrate and perpendicular to the first direction is referred to as a second direction. In addition, a direction vertical to the surface of the substrate is referred to as a vertical direction.

Figure 2:
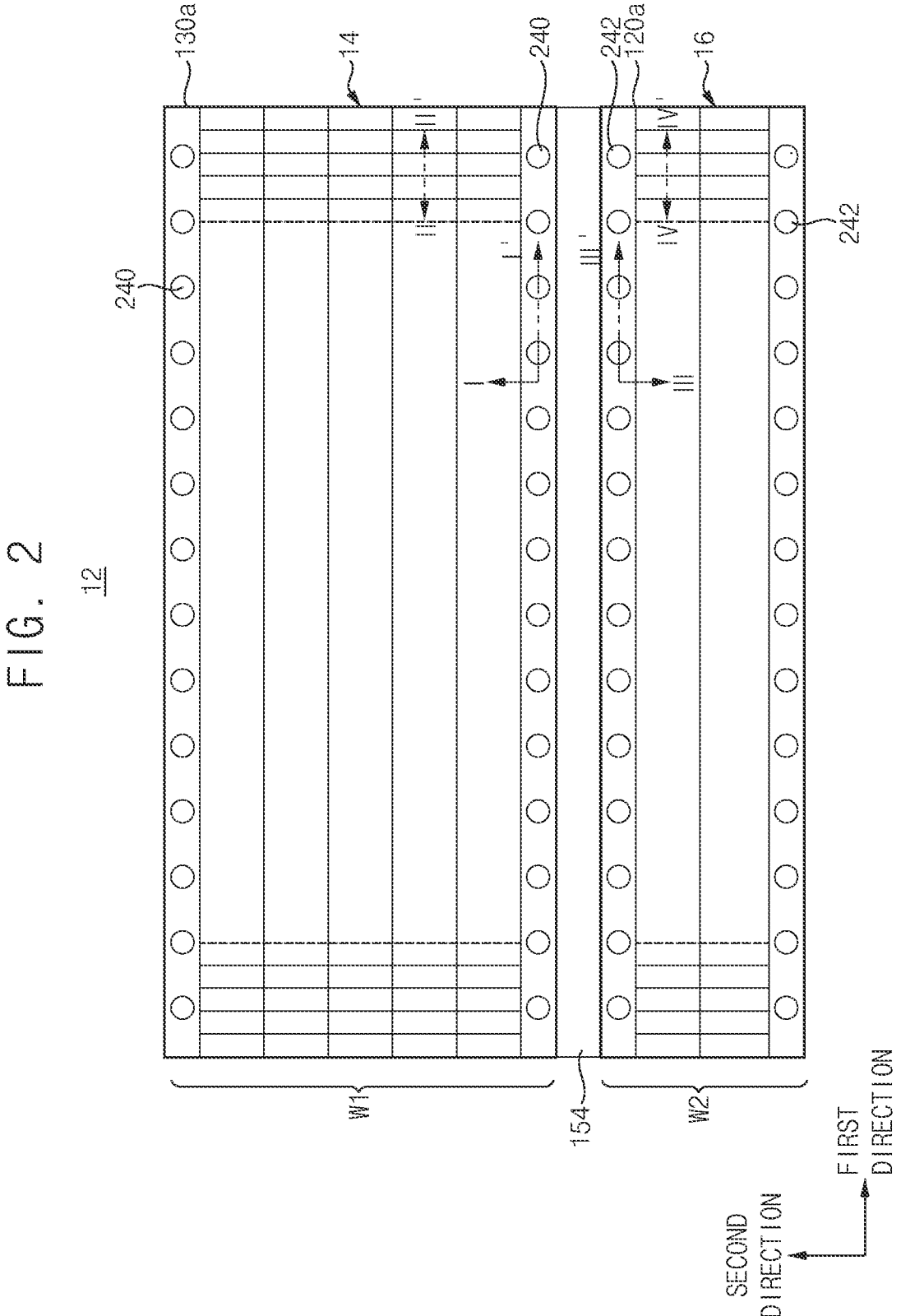
FIG. 2 is a plan view of a MAT region of a vertical memory device according to example embodiments.
Figure 3:
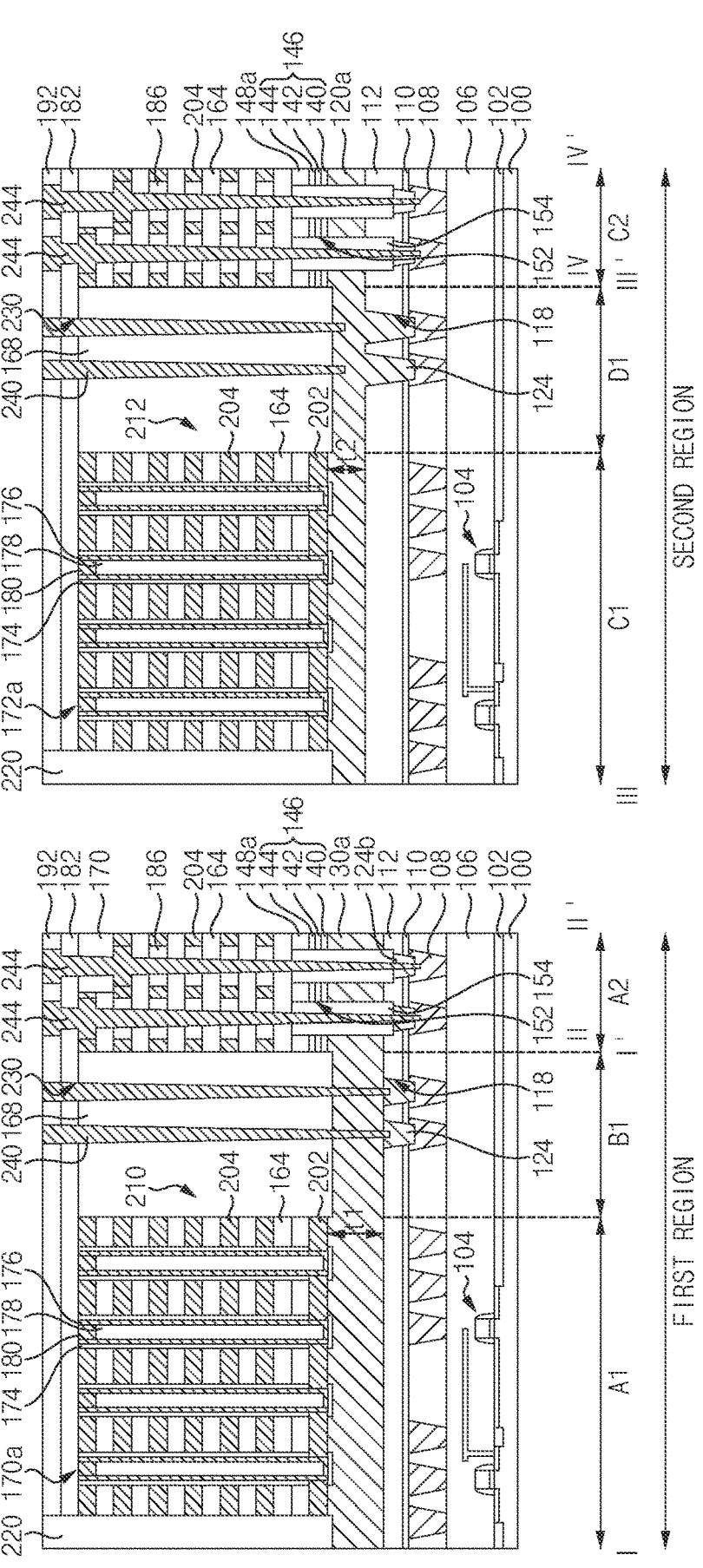
FIG. 3 is cross-sectional views of a portion of a vertical memory device according to example embodiments.
Figure 4:
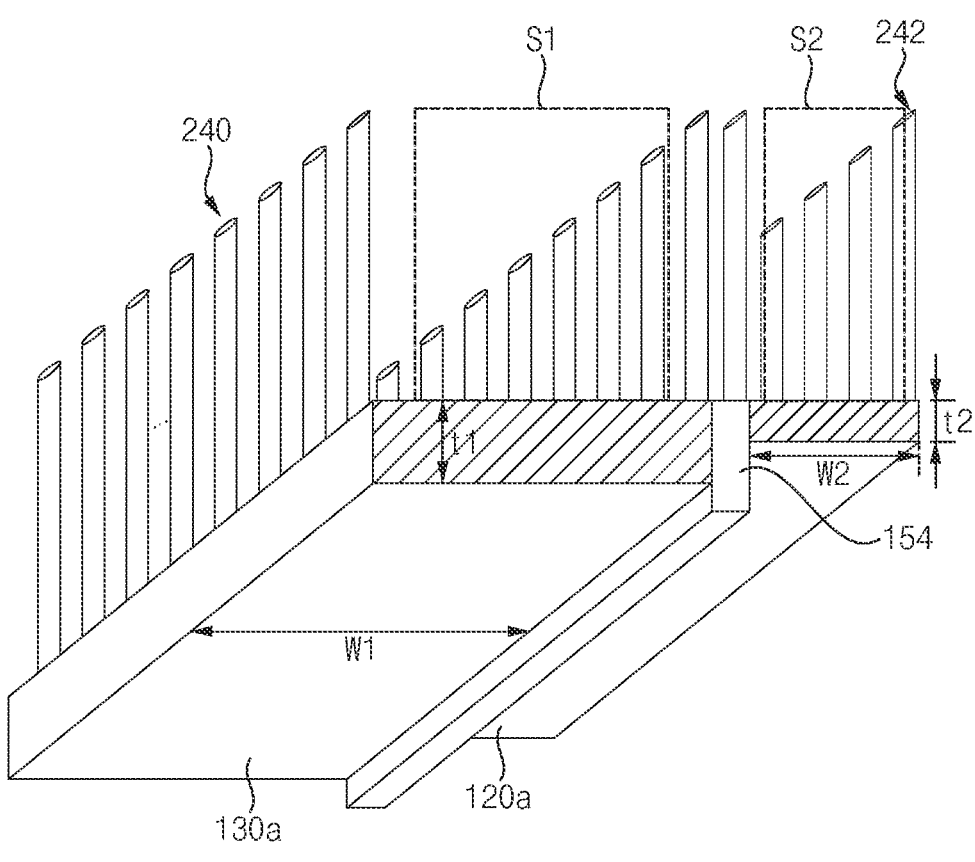
FIG. 4 is a perspective view illustrating a portion of a vertical memory device according to example embodiments.
Figure 5:
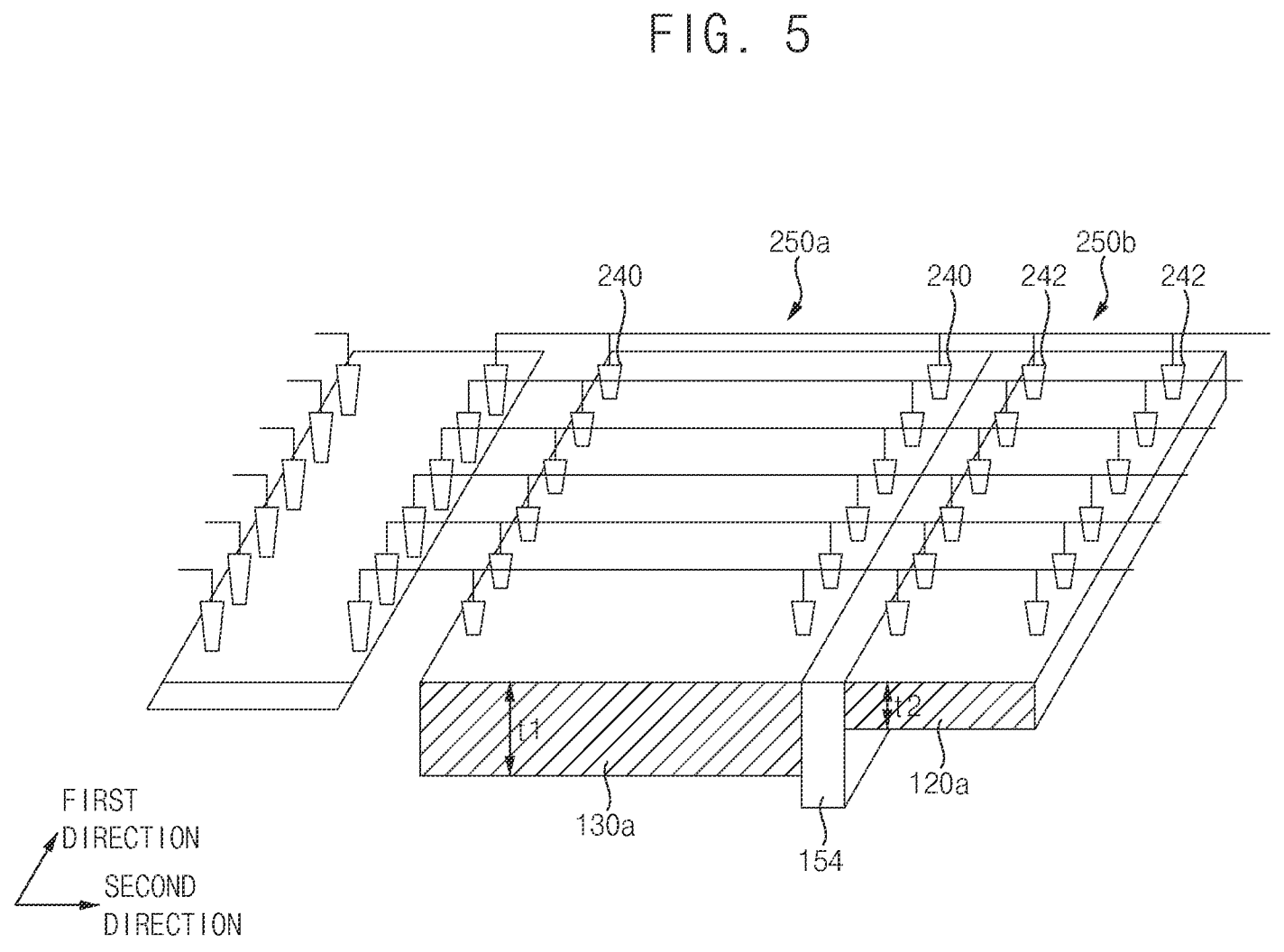

FIG. 1 is a plan view of a chip region of a vertical memory device according to example embodiments. FIG. 2 is a plan view of a MAT region of a vertical memory device according to example embodiments. FIG. 3 is cross-sectional views of a portion of a vertical memory device according to example embodiments. FIG. 4 is a perspective view illustrating a portion of a vertical memory device according to example embodiments. FIGS. 5 and 6 are a perspective view and a cross-sectional view illustrating a portion of a vertical memory device according to example embodiments.

FIG. 3 includes cross-sectional views taken along lines I-I', II-II', III-III', and IV-IV' of FIG. 2. In FIG. 3, a cross-sectional view on the left shows a structure on a first region, and a cross-sectional view on the right is a structure on a second region. FIG. 4 illustrates sub-semiconductor patterns and common source contacts in the vertical memory device. FIG. 5 illustrates a sub-semiconductor pattern, common source contacts, and through via contacts in the vertical memory device. FIG. 6 is provided to explain operations of memory cells on the first and second regions. In FIG. 6, a cross-sectional view on a left represents an operation of memory cells on the first region, and a cross-sectional view on a right represents an operation of memory cells on the second region.

Referring to FIGS. 1 and 2, a substrate may include a chip region 10 in which memory chips are formed. The chip region 10 may have a rectangular shape with a long side extending in the first direction.

A plurality of MAT regions 12 may be disposed in the chip region 10. In FIG. 1, four MAT regions 12 may be disposed in the chip region 10. However, the number of the MAT regions 12 disposed in the chip region 10 is not limited thereto.

A plurality of regions may be disposed in one MAT region 12. For example, in some example embodiments, a first region 14 and a second region 16 may be disposed one MAT region 12, as illustrated in FIG. 1. One common source plate may be formed on each of regions, and thus the first and second regions 14 and 16 may be divided by the common source plate.

Each of the first and second regions 14 and 16 may be spaced apart from each other in the second direction. Each of the first and second regions 14 and 16 may have a rectangular shape with a long side extending in the first direction.

At least one of the plurality of regions may have a width in the second direction different from widths in the second direction of the other regions. For example, in some example embodiments, each of the first and second regions 14 and 16 may have the same length in the first direction. In example embodiments, the first and second regions 14 and 16 may not have the same size depending on arrangements of transistors and page buffer circuits of peripheral circuits formed on the substrate.

In some example embodiments, the first and second regions 14 and 16 may be disposed in one MAT region 12. However, embodiments are not limited thereto and, in some example embodiments, three or more regions may be disposed in one MAT region 12, and at least one of the regions may have a different width in the second direction.

The first region 14 may have a first width W1 in the second direction, and the second region 16 may have a second width W2 that is less than the first width W1 in the second direction. Therefore, the first region 14 may have a size greater than a size of the second region 16. For example, an area of the first region 14 may be greater than an area of the second region 16.

Structures constituting memory cells may be formed on the substrate 100 in the first region 14 and the second region 16, respectively. Hereinafter, the structures formed on the first and second regions 14 and 16 will be described.

Referring to FIGS. 2 and 3, circuit patterns constituting peripheral circuits may be formed on the first and second regions 14 and 16 of the substrate 100, respectively.

The substrate 100 may be divided into a field region in which an isolation pattern 102 is formed and an active region in which the isolation pattern 102 is not formed. Lower transistors 104 and lower wirings 108 serving as the circuit patterns may be formed on the substrate 100.

A first lower insulating interlayer 106 may be formed on the first and second regions 14 and 16 of the substrate 100 to cover the circuit patterns. A capping insulation layer 110 may be formed on an uppermost lower wiring 108 and the first lower insulating interlayer 106. The capping insulation layer 110 may include silicon nitride. A second lower insulating interlayer 112 may be formed on the capping insulation layer 110.

Sub-semiconductor patterns may be formed on the second lower insulating interlayer 112. The sub-semiconductor patterns may serve as common source plates of memory cells formed thereon.

A first sub-semiconductor pattern 130a may be formed on the second lower insulating interlayer 112 in the first region 14, and a second sub-semiconductor pattern 120a may be formed on the second lower insulating interlayer 112 in the second region 16.

Referring to FIGS. 3 to 5, the first sub-semiconductor pattern 130a may cover most of the second lower insulating interlayer 112 on the first region 14. The second sub-semiconductor pattern 120a may cover most of the second lower insulating interlayer 112 on the second region 14. A width of the first sub-semiconductor pattern 130a in the second direction may be greater than a width of the second sub-semiconductor pattern 120a in the second direction. The first sub-semiconductor pattern 130a may have the first width W1 in the second direction, and the second sub-semiconductor pattern 120a may have the second width W2. The first width W1 may be greater than the second width W2.

In some example embodiments, a resistance of the first sub-semiconductor pattern 130a may be the same as or similar to a resistance of the second sub-semiconductor pattern 120a. Since the width of the first sub-semiconductor pattern 130a in the second direction is greater than the width of the second sub-semiconductor pattern 120a in the second direction, a size of the first sub-semiconductor pattern 130a may be greater than a size of the second sub-semiconductor pattern 120a. For example, an area of the first sub-semiconductor pattern 130a may be greater than an area of the second sub-semiconductor pattern 120a. When the first and second sub-semiconductor patterns 130a and 120a have the same structure (e.g., the same thickness and the same material), the resistance of the first sub-semiconductor pattern 130a may be greater than the resistance of the second sub-semiconductor pattern 120a.

In order to reduce a difference between the resistance of the first sub-semiconductor pattern 130a and the resistance of the second sub-semiconductor pattern 120a, in some example embodiments, the first sub-semiconductor pattern 130a may be configured to have a reduced resistance. Therefore, a sheet resistance of the first sub-semiconductor pattern 130a may be lower than a sheet resistance of the second sub-semiconductor pattern 120a.

Upper surfaces (i.e., surfaces disposed farthest from an upper surface of the substrate 100) of the first and second sub-semiconductor patterns 130a and 120a may be coplanar with each other. The upper surfaces of the first and second sub-semiconductor patterns 130a and 120a may be substantially flat. The memory cells may be formed on the upper surfaces of the first and second sub-semiconductor patterns 130a and 120a. In order to easily form the memory cells on the upper surfaces of the first and second sub-semiconductor patterns 130a and 120a, the upper surfaces of the first and second sub-semiconductor patterns 130a and 120a may be substantially flat without a step difference.

A lower surface of the first sub-semiconductor pattern 130a and a lower surface of the second sub-semiconductor pattern 120a may be positioned on different planes. At least a portion of the lower surface of the first sub-semiconductor pattern 130a may be lower than the lower surface of the second sub-semiconductor pattern 120a.

In example embodiments, the first sub-semiconductor pattern 130a may include a material that is the same as a material of the second sub-semiconductor pattern 120a. For example, in some example embodiments, the first and second sub-semiconductor patterns 130a and 120a may include polysilicon doped with N-type impurities. For example, in some example embodiments, the first and second sub-semiconductor patterns 130a and 120a may be doped with N-type impurities having the same concentration.

In some example embodiments, an impurity concentration of the first sub-semiconductor pattern 130a may be higher than an impurity concentration of the second sub-semiconductor pattern 120a. Therefore, the resistance of the material of the first sub-semiconductor pattern 130a may be decreased.

In some example embodiments, the first sub-semiconductor pattern 130a may have a thickness greater than a thickness of the second sub-semiconductor pattern 120a.

In example embodiments, as shown in FIG. 4, the first sub-semiconductor pattern 130a may have a first thickness t1 in an entirety of the first region, and the second sub-semiconductor pattern 120a may have a second thickness t2 in an entire of the second region.

Since the first sub-semiconductor pattern 130a has the first thickness t1 that is greater than the second thickness t2 of the second sub-semiconductor pattern 120a, the sheet resistance of the first sub-semiconductor pattern 130a may be decreased. That is, the sheet resistance of the first sub-semiconductor pattern may be lower than the sheet resistance of the second sub-semiconductor pattern. Accordingly, a difference between the resistance of the first sub-semiconductor pattern 130a and the resistance the second sub-semiconductor pattern 120a caused by the different widths of the first and second sub-semiconductor patterns 130a and 120a may be decreased. Accordingly, the first and second sub-semiconductor patterns 130a and 120a may have the same or similar resistance.

Referring to FIG. 3, a lower contact plug 124 electrically connected to the lower wiring 108 may be formed on a portion of the lower surface of each of the first and second sub-semiconductor patterns 130a and 120a.

The first and second sub-semiconductor patterns 130a and 120a may include openings 152 exposing an upper surface of the second lower insulating interlayer 112. In example embodiments, the opening 152 included in the first and second sub-semiconductor patterns 130a and 120a may be positioned at a region for forming through cell contacts.

A lower insulation pattern 154 may be formed on the second lower insulating interlayer 112 to fill the opening 152 and a space between the first and second sub-semiconductor patterns 130a and 120a.

A protective pattern 124b may be disposed below the lower insulation pattern 154 for forming the through cell contact. In example embodiments, the protective pattern 124b may include a material substantially the same as a material of the first and second sub-semiconductor patterns 130a and 120a. For example, the protective pattern 124b may include polysilicon doped with N-type impurities.

First cell structures S1 may be formed on the first sub-semiconductor pattern 130a and the lower insulation pattern 154 in the first region 14. Second cell structures S2 may be formed on the second sub-semiconductor pattern 120a and the lower insulation pattern 154 in the second region 16. First common source contacts 240 contacting an upper surface of the first sub-semiconductor pattern 130*a* may be formed at both edge portions in the second direction of the first region. The first common source contacts 240 may be arranged along both of the edge portions of the first region. The first cell structures S1 may be disposed between the first common source contacts 240 in the second direction on the first region 14. Second common source contacts 242 contacting an upper surface of the second sub-semiconductor pattern 120*a* may be formed at both edge portions in the second direction of the second region 16. The second common source contacts 242 may be arranged along both of the edge portions of the second region. The second cell structures S2 may be disposed between the second common source contacts 242 in the second direction on the second region 16.

The first and second cell structures S1 and S2 may have substantially the same shape and substantially the same configuration. Therefore, hereinafter, the first cell structure S1 formed on the first region 14 may be mainly described for conciseness.

The first cell structure S1 may include a first pattern structure 210, a first channel structure 170*a* and a channel connection pattern 202.

The first pattern structure 210 may include a first insulation layer 164 and a gate pattern 204 alternately and repeatedly stacked. The first pattern structure 210 may extend in the first direction, and have a stepped shape in edge portions in the first direction thereof. The gate pattern 204 may include, e.g., tungsten, and the first insulation layer 164 may include, e.g., silicon oxide.

The first channel structure 170*a* may pass through the first pattern structure 210, and may extend to an inner portion of the first sub-semiconductor pattern 130*a*. The first channel structure 170*a* may include a charge storage structure 174, a channel 176, a filling insulation pattern 178 and a capping pattern 180. The charge storage structure 174 may include a blocking layer, a charge storage layer, and a tunnel insulation layer.

The channel connection pattern 202 may contact a lower portion of the channel 176 in the first channel structure 170*a*, and may directly contact an upper surface of the first sub-semiconductor pattern 130*a*. That is, the channel connection pattern 202 may be disposed between the first sub-semiconductor pattern 130*a* and the first pattern structure 210.

In the first cell structure S1, each of the gate patterns 204 and the first channel structure 170*a* may serve as a memory cell. The gate patterns 204 stacked in the vertical direction and one first channel structure 170*a* passing through the gate patterns 204 may serve as one cell string. A lower portion of each of the cell strings may contact the first sub-semiconductor pattern 130*a* serving as the common source plate.

The second cell structure S2 having a structure that is the same as the structure of the first cell structure may be formed on the second sub-semiconductor pattern 120*a* and the lower insulation pattern 154 in the second region. The second cell structure S2 may include a second pattern structure 212, a second channel structure 172*a* and the channel connection pattern 202.

Since the first sub-semiconductor pattern 130*a* has the width greater than the width of the second sub-semiconductor pattern 120*a*, the number of the first channel structures 170*a* arranged in the second direction on the first sub-semiconductor pattern 130*a* may be greater than the number of the second channel structures 172*a* arranged in the second direction on the second sub-semiconductor pattern 130*a*. Therefore, the number of cell strings arranged in the second direction on the first sub-semiconductor pattern 130*a* may be greater than the number of cell strings arranged in the second direction on the second sub-semiconductor pattern 120*a*.

A first insulating interlayer 168, a second insulating interlayer 182, and a third insulating interlayer 192 may be formed on the first and second sub-semiconductor patterns 130*a* and 120*a* to cover the first and second cell structures.

Through cell contacts 244 may be formed at step portions of the first and second pattern structures 210 and 212. The through cell contact 244 may pass through the first to third insulating interlayers 168, 182 and 192 and the step portions of the first and second pattern structures 210 and 212. The through cell contact 244 may contact an uppermost gate pattern 204 among the gate patterns penetrated by the through cell contact 244, and the lower wiring 108 under the first and second sub-semiconductor patterns 130*a* and 120*a*. The through cell contact 244 may pass through the lower insulation pattern 154 and the protective pattern 109 thereunder, and thus may contact the lower wiring 108.

Ones of through via contacts (not shown) may pass through the insulating interlayers 168, 182 and 192 between the first region 14 and the second region 16, and may contact the lower wiring 108. A bit line contact (not shown) may pass through the insulating interlayers 168, 182 and 192, and may contact the capping pattern 180 of each of the channel structures 170*a*, 172*a*.

The first common source contacts 240 may pass through the first to third insulating interlayers 168, 182 and 192, and may contact the first sub-semiconductor pattern 130*a*. The second common source contacts 242 may pass through the first to third insulating interlayers 168, 182, and 192, and may contact the second sub-semiconductor pattern 120*a*.

The first common source contacts 240 may be disposed on upper surfaces of both edges in the second direction of the first sub-semiconductor pattern 130*a*. The first common source contacts 240 may be spaced apart from each other in the first direction. The second common source contacts 242 may be disposed on upper surfaces of both edges in the second direction of the second sub-semiconductor pattern 120*a*. The second common source contacts 242 may be spaced apart from each other in the first direction. The first source contacts 240 may be spaced apart from the first cell structure, and the second common source contacts 242 may be spaced apart from the second cell structure.

Referring to FIGS. 5 and 6, an upper insulating interlayer and a first upper wiring 250*a* may be further formed on the third insulating interlayer 192 and the first common source contacts 240 in the first region 14. The upper insulating interlayer and a second upper wiring 250*b* may be further formed on the third insulating interlayer 192 and the second common source contacts 242 in the second region 16.

In example embodiments, the first upper wiring 250*a* may be connected to the first common source contacts 240 and an upper contact 254. For example, the first upper wiring 250*a* may include a wiring for connecting the first common source contact 240 and the through via contact 252 and a wiring for connecting the upper contact 254 and the through via contact 252.

In example embodiments, the second upper wiring 250*b* may be connected to the second common source contact 242 and the upper contact 254. For example, the second upper wiring 250*b* may include a wiring for connecting the second common source contact 242 and the through via contact 252 and a wiring for the upper contact 254 and the through via contact 252.

Operations of the semiconductor device may be briefly described with reference to FIGS. 2, 5 and 6.

Referring to FIGS. 2, 5 and 6, memory cells formed on the first sub-semiconductor pattern 130a in the first region 14 may be operated by electrical signals (e.g., voltage or currents) applied by a plurality of first common source contacts 130a disposed at both edges in the second direction of the first sub-semiconductor pattern 130a, respectively.

The electrical signals may be supplied from the peripheral circuits formed on the substrate 100, and transmitted to the first common source contact 240 through the through via contact 252 and the first upper wiring 250a. Thus, the electrical signals may be applied to the first sub-semiconductor pattern 130a. The electrical signals may be transferred from a bottom to a top of the channel included in each of the first channel structures 170a, and then the electrical signals may be applied back to the peripheral circuits through the first upper wiring 250a and the through via contact 252.

For example, an erase voltage may be supplied from a common source line driver in the peripheral circuits, and the erase voltage may be applied to the first sub-semiconductor pattern 130a through the first common source contacts 240. The erase voltage may be applied to the channel 176 included in each of the first channel structures 170a through the first sub-semiconductor pattern 130a. Accordingly, data stored in the memory cells on the first channel structures 170a may be collectively erased.

In the memory cells formed on the second sub-semiconductor pattern 120a in the second region 16, electrical signals may be transmitted to the channel 176 included in each of the second channel structures 172a through the second sub-semiconductor pattern 120a in the same manner as for the memory cells formed on the first sub-semiconductor pattern 130a in the first region 14. That is, the memory cells formed on the second sub-semiconductor pattern 120a in the second region 16 may be operated by electrical signals applied by a plurality of second common source contacts 242 disposed at the both edges in the second direction of the second sub-semiconductor pattern 120a, respectively.

For example, an erase voltage may be supplied from the common source line driver in the peripheral circuits, and the erase voltage may be applied to the second sub-semiconductor pattern 120a through the second common source contacts 242. The erase voltage may be applied to the channel 176 of each of the second channel structures 172a through the second sub-semiconductor pattern 120a. Accordingly, data stored in memory cells on the second channel structure 172a may be collectively erased.

Since the first common source contact 240 is disposed on both sides in the second direction of the first sub-semiconductor pattern 130a, at least the electrical signal may be transferred to the first channel structure 170a disposed in a center of the first sub-semiconductor pattern 130a in the second direction from one side of the first sub-semiconductor pattern 130a in the second direction. Similarly, since the second common source contact 242 is disposed on both sides in the second direction of the second sub-semiconductor pattern 120a, at least the electrical signal may be transferred to the second channel structure disposed in a center of the second sub-semiconductor pattern 120a in the second direction from one side of the second sub-semiconductor pattern 120a in the second direction.

In this case, the first width W1 of the first sub-semiconductor pattern 130a in the second direction may be greater than the second width W2 of the second sub-semiconductor pattern 120a in the second direction. Therefore, a distance from the first common source contact 240 to the center of the first sub-semiconductor pattern 130a in the second direction may be greater than a distance from the second common source contact 242 to the center of the second sub-semiconductor pattern 120a in the second direction. Therefore, there is a disadvantage in that a time for transferring signals to the memory cells formed on the first sub-semiconductor pattern 130a and a time for transferring signals to the memory cells formed on the second sub-semiconductor pattern 120a may not be the same. Thus, a timing skew and signal noise may occur in the memory cells in the vertical memory device.

However, according to various example embodiments, the first sub-semiconductor pattern 130a having a long distance for transferring signals from the common source contact may have a sheet resistance lower than a sheet resistance the second sub-semiconductor pattern 120a. For example, the first sub-semiconductor pattern 130a may have a thickness greater than a thickness of the second sub-semiconductor pattern 120a. Thus, a difference between a resistance of the first sub-semiconductor pattern 130a and a resistance the second sub-semiconductor pattern 120a may be decreased. In some example embodiments, the first and second sub-semiconductor patterns 130a and 120a may have substantially the same or similar resistance. Accordingly, in the memory cells formed on the first sub-semiconductor pattern 130a and the memory cells formed on the second sub-semiconductor pattern 120a, the timing skew and the signal noise may be decreased.

Various embodiments may be presented in which the first sub-semiconductor pattern having the long distance for transferring signals from the common source contact has the sheet resistance lower than the sheet resistance of the second sub-semiconductor pattern. In each of the various embodiments, the cell structures formed on the first and second sub-semiconductor patterns may be substantially the same as those described with reference to FIGS. 1 to 6. Therefore, only the common source contact may be mainly described.

Figure 7:
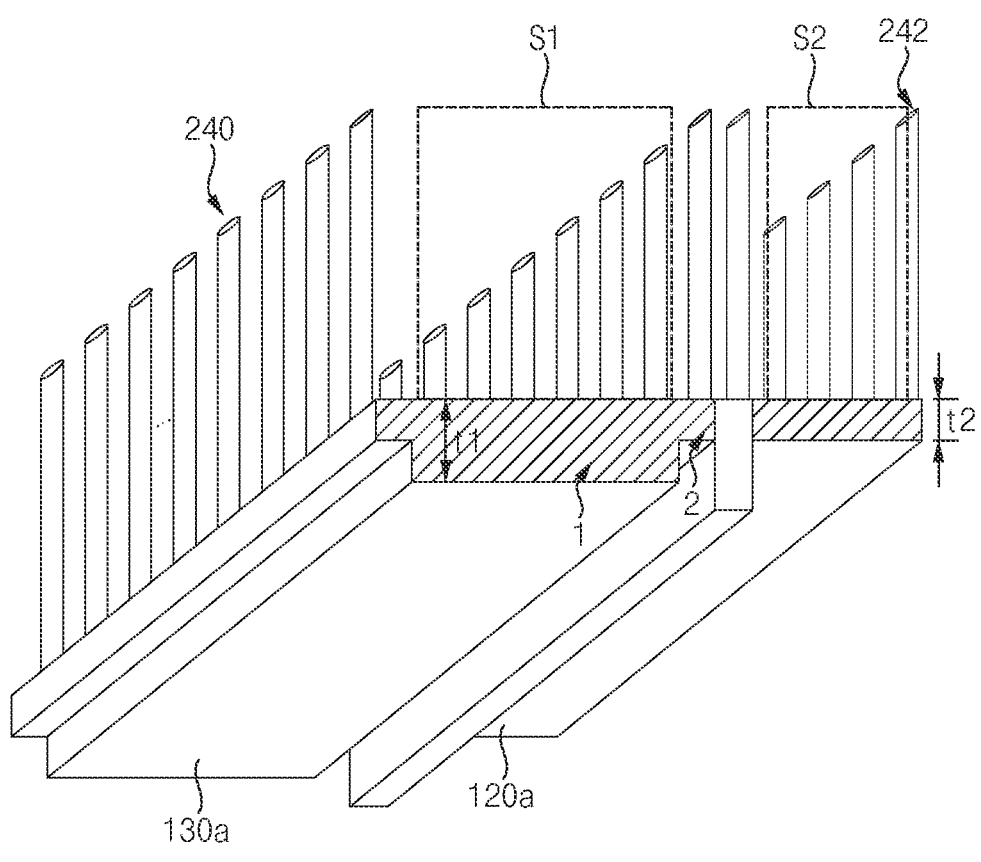
FIG. 7 is a perspective view illustrating a portion of a vertical memory device according to example embodiments.
Figure 8:
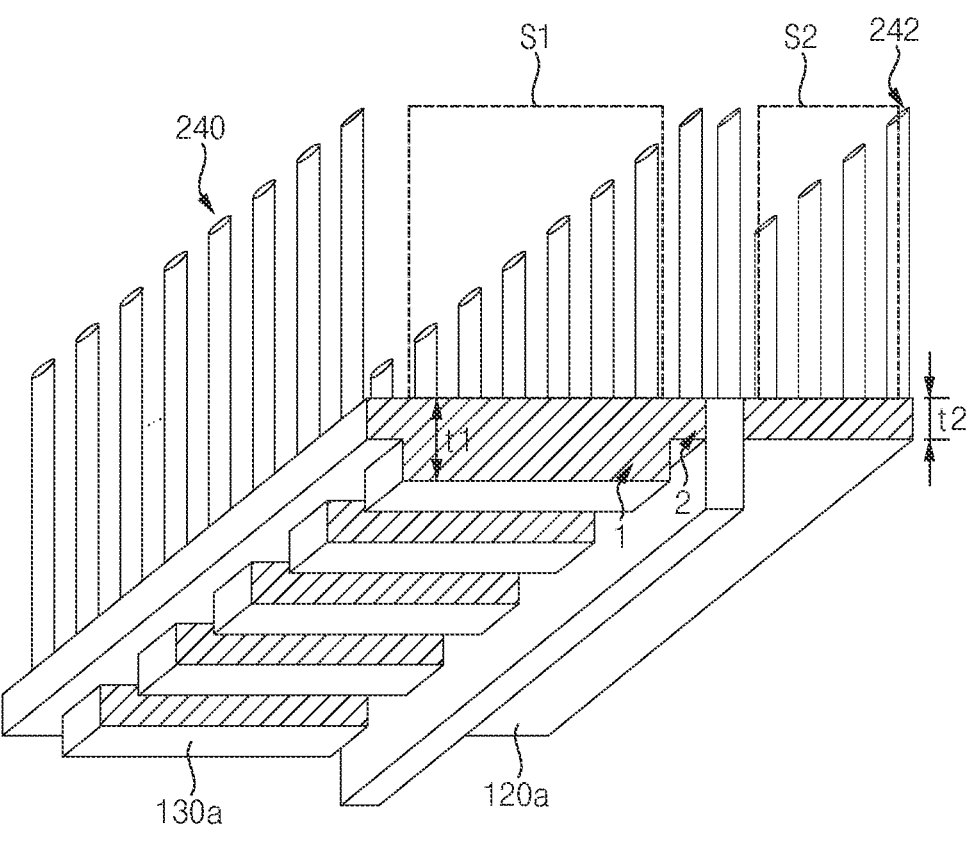
FIG. 8 is a perspective view illustrating a portion of a vertical memory device according to example embodiments.

FIG. 7 is a perspective view illustrating a portion of a vertical memory device according to example embodiments. FIG. 8 is a perspective view illustrating a portion of a vertical memory device according to example embodiments.

Referring to FIGS. 7 and 8, a first sub-semiconductor pattern 130a may be formed on the first region, and a second sub-semiconductor pattern 120a may be formed on the second region.

Upper surfaces of the first and second sub-semiconductor patterns 130a and 120a may be coplanar with each other. The upper surfaces of the first and second sub-semiconductor patterns 130a and 120a may be substantially flat.

A lower surface of the first sub-semiconductor pattern 130a and a lower surface of the second sub-semiconductor pattern 120a may be positioned on different planes. That is, a lowermost surface of the first sub-semiconductor pattern 130a and a lowermost surface of the second sub-semiconductor pattern 120a may be positioned on different planes The first and second sub-semiconductor patterns 130a and 120a may include the same material. In example embodiments, the first and second sub-semiconductor patterns 130a and 120a may include polysilicon doped with N-type impurities. For example, in some example embodiments, the first and second sub-semiconductor patterns 130a and 120a may be doped with impurities having the same concentration. In some example embodiments, an impurity concentration of the first sub-semiconductor pattern 130a may be higher than that of the second sub-semiconductor pattern 120a.

The first sub-semiconductor pattern 130a may include a first portion 1 having a first thickness t1 and a second portion 2 having a second thickness t2 less than the first thickness t1.

The second sub-semiconductor pattern 120a may have the second thickness t2. That is, the first sub-semiconductor pattern 130a may be locally thicker than the second sub-semiconductor pattern 120a.

In example embodiments, as shown in FIG. 7, the first portion 1 of the first sub-semiconductor pattern 130a may be positioned at a central region of the first region in the second direction. For example, the first portion 1 of the first sub-semiconductor pattern 130a may correspond to a portion where memory cells are formed, except for a portion where the first common source contacts 240 are formed.

In example embodiments, as shown in FIG. 8, the first portion 1 of the first sub-semiconductor pattern 130a may have a line shape extending in one direction in the first region. A plurality of the first portion 1 having the first thickness t1 may be spaced apart from each other. For example, in some example embodiments, the first portions 1 may have lines extending in the first direction. In some example embodiments, the first portions 1 may have lines extending in the second direction.

In some example embodiments, a layout of a bottom surface of the first portions 1 of the first sub-semiconductor pattern 130a may have, e.g., a polygonal, circular, or irregular shape.

The first sub-semiconductor pattern 130a may have two or more thicknesses depending on positions thereof, and thus the thickness of the first sub-semiconductor pattern may be equal to or greater than the second thickness depending on the positions thereof. The first portion 1 of the first sub-semiconductor pattern 130a may have the first thickness greater than the second thickness of the second sub-semiconductor pattern 120a. The sheet resistance of the first sub-semiconductor pattern may be decreased by adjusting a size and a thickness of the first portion of the first sub-semiconductor pattern 130a. The sheet resistance of the first sub-semiconductor pattern 130a may be lower than the sheet resistance of the second sub-semiconductor pattern 120a. Therefore, a difference between a resistance of the first sub-semiconductor pattern 130a and a resistance of the second sub-semiconductor pattern 120a may be decreased. The first and second sub-semiconductor patterns 130a and 120a may have substantially the same or similar resistance.

Figure 9:
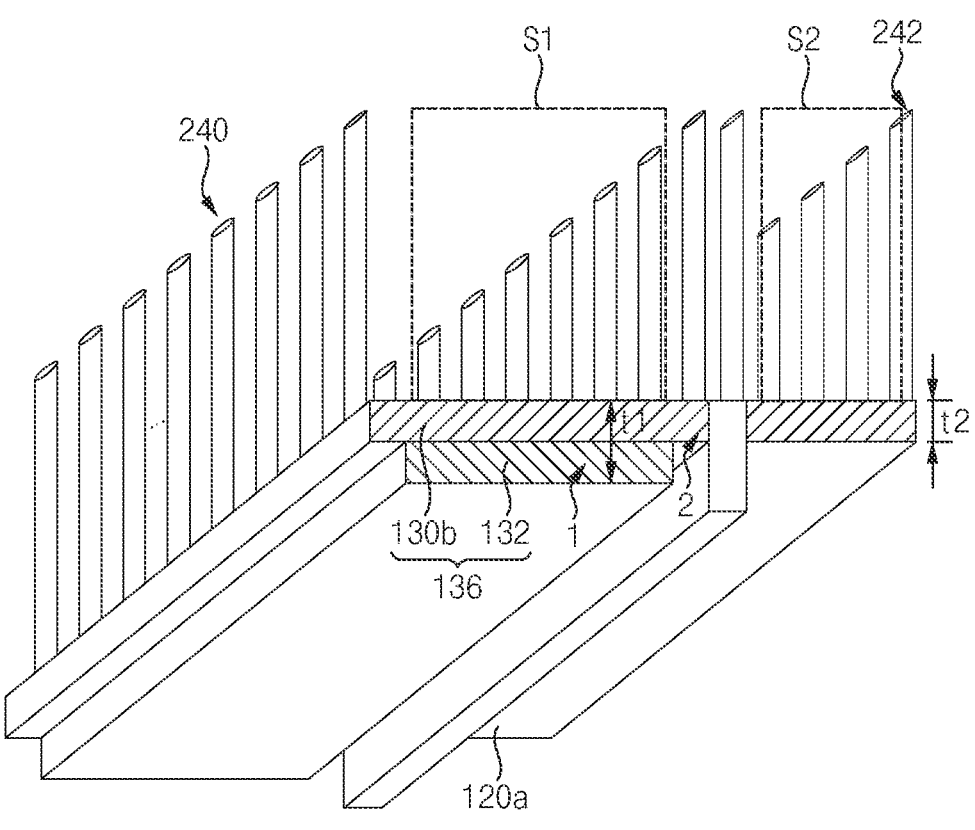
FIG. 9 is a perspective view illustrating a portion of a vertical memory device according to example embodiments.
Figure 10:
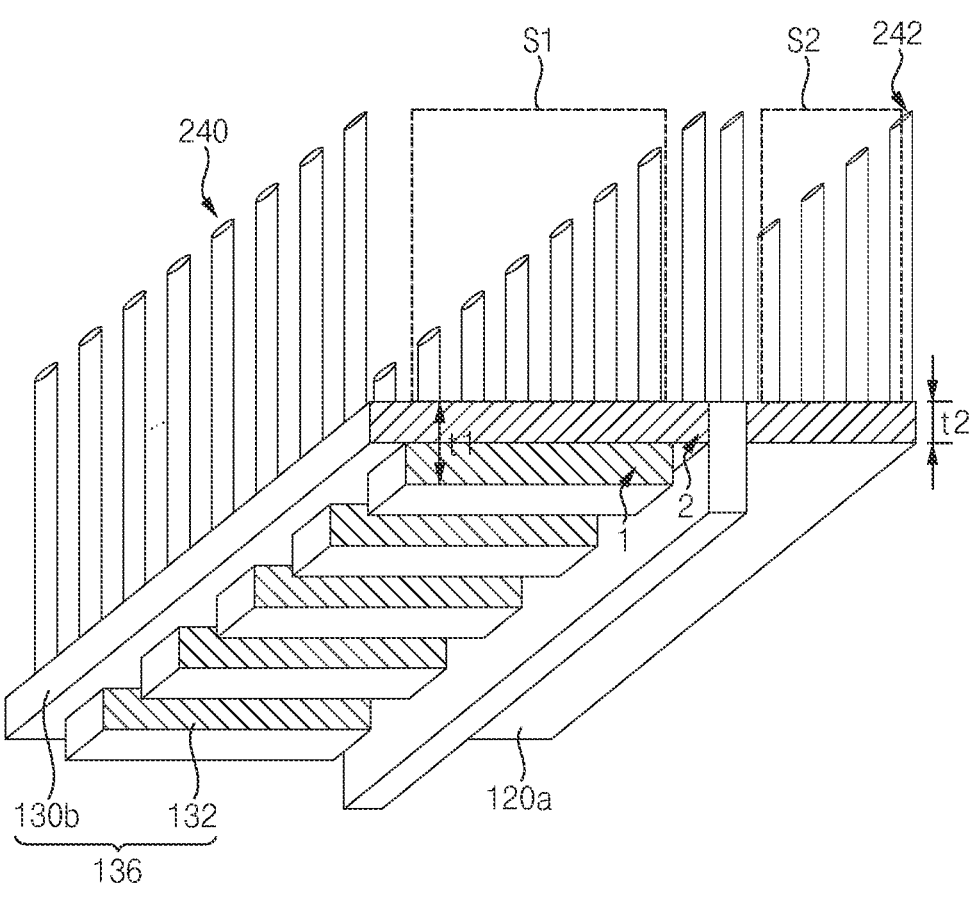
FIG. 10 is a perspective view illustrating a portion of a vertical memory device according to example embodiments.

FIG. 9 is a perspective view illustrating a portion of a vertical memory device according to example embodiments. FIG. 10 is a perspective view illustrating a portion of a vertical memory device according to example embodiments.

Referring to FIGS. 9 and 10, a first sub-semiconductor structure 136 may be formed on the first region, and a second sub-semiconductor pattern 120a may be formed on the second region.

Upper surfaces of the first sub-semiconductor structure 136 and the second sub-semiconductor pattern 120a may be coplanar with each other. The upper surfaces of the first sub-semiconductor structure 136 and the second sub-semiconductor pattern 120a may be substantially flat.

A lower surface of the first sub-semiconductor structure 136 and a lower surface of the second sub-semiconductor pattern 120a may be positioned on different planes.

The first sub-semiconductor structure 136 may have a structure in which a lower conductive pattern 132 and the first sub-semiconductor pattern 130b are stacked. The lower conductive pattern 132 may directly contact at least a portion of a lower surface of the first sub-semiconductor pattern 130b. An upper portion of the first sub-semiconductor structure 136 may include a semiconductor material.

In example embodiments, the first sub-semiconductor pattern 130b may include a material that is the same as a material of the second sub-semiconductor pattern 120a. For example, the first and second sub-semiconductor patterns 130b and 120a may include polysilicon doped with N-type impurities. For example, in some example embodiments, the first and second sub-semiconductor patterns 130b and 120a may be doped with impurities having the same concentration. In some example embodiments, an impurity concentration of the first sub-semiconductor pattern 130b may be higher than an impurity concentration of the second sub-semiconductor pattern 120a.

In example embodiments, the first sub-semiconductor pattern 130b and the second sub-semiconductor pattern 120a may have the same thickness, e.g., a second thickness t2.

Since the first sub-semiconductor structure 136 includes the first sub-semiconductor pattern 130b and the lower conductive pattern 132 contacting the lower surface of the first sub-semiconductor pattern 130b, at least a portion of the first sub-semiconductor structure 136 may have a first thickness t1 greater than a thickness (i.e., the second thickness t2) of the second sub-semiconductor pattern 120a. A stacked portion of the first sub-semiconductor pattern 130b and the lower conductive pattern 132 in the first sub-semiconductor structure 136 may have the first thickness t1.

The lower conductive pattern 132 may include a material having a resistance lower than a resistance of the first sub-semiconductor pattern 130b. In example embodiments, the lower conductive pattern 132 may include a metal. The lower conductive pattern 132 may include, e.g., tungsten, copper, or aluminum. In some example embodiments, the lower conductive pattern 132 may include polysilicon doped with N-type impurities having an impurity concentration higher than an impurity concentration of the first sub-semiconductor pattern 130b.

In example embodiments, as shown in FIG. 9, the lower conductive pattern 132 may be positioned at a central portion of the first region in the second direction. The lower conductive pattern 132 may be positioned in a region where memory cells are formed, except for a region where the first common source contacts 240 are formed.

In example embodiments, as shown in FIG. 10, the lower conductive pattern 132 may have a line shape extending in one direction in the first region. A plurality of the lower conductive patterns 132 may be arranged to be spaced apart from each other. For example, in some example embodiments, each of the lower conductive patterns 132 may have a line shape extending in the first direction. In some example embodiments, each of the lower conductive patterns 132 may have a line shape extending in the second direction.

In some example embodiments, the lower conductive pattern 132 may contact the entire lower surface of the first sub-semiconductor pattern 130b.

As described above, a portion of the first sub-semiconductor structure 136 including the lower conductive pattern 132 may have the thickness greater than the thickness of the second sub-semiconductor pattern 120a. The sheet resistance of the first sub-semiconductor structure 136 may be decreased by adjusting the size, thickness and/or material of the lower conductive pattern 132. That is, the sheet resistance of the first sub-semiconductor structure 136 may be decreased by adjusting the area, thickness and/or material of the lower conductive pattern 132. The sheet resistance of the first sub-semiconductor structure 136 may be lower than the sheet resistance of the second sub-semiconductor pattern 120a. Accordingly, the difference between a resistance of the first sub-semiconductor structure 136 and a resistance of the second sub-semiconductor pattern 120a may be decreased.

The first sub-semiconductor structure 136 and the second sub-semiconductor pattern 120*a* may have the same or similar resistance.

FIGS. 11 to 25 are cross-sectional views illustrating a method of manufacturing a vertical memory device according to example embodiments.

FIGS. 11 to 25 are cross-sectional views taken along lines II-I', II-II', III-III', and IV-IV' of FIG. 2. In each of figures, the cross-sectional view on a left is a structure on a first region, and the cross-sectional view on a right is a structure on a second region.

Referring to FIG. 11, a substrate 100 may include a chip region, and the chip region may include a plurality of MAT regions. The first region and the second region may be included in one MAT region. Circuit patterns constituting peripheral circuits may be formed on the first and second regions of the substrate 100, and first and second lower insulating interlayers 106 and 112 may be formed to cover the circuit patterns.

An isolation pattern 102 may be formed at the first and second regions of the substrate 100 by performing a shallow trench isolation process. Accordingly, the substrate 100 may be divided into a field region in which the isolation pattern 102 is formed and an active region in which the isolation pattern 102 is not formed. Lower transistors 104 and lower wirings 108 may be formed on the substrate 100. The lower transistors 104 and the lower wirings 108 may serve as the circuit patterns constituting the peripheral circuits. The first lower insulating interlayer 106 may be formed on the substrate 100 in the first and second regions to cover the circuit patterns. A capping insulation layer 110 may be formed to cover the uppermost lower wiring 108 and the first lower insulating interlayer 106. The capping insulation layer 110 may include silicon nitride. The second lower insulating interlayer 112 is formed on the capping insulation layer 110. The first and second lower insulating interlayers 106 and 112 may include silicon oxide.

The first region may include regions A1 and A2 for forming memory cells and a region B1 for forming a common source contact. The region for forming the memory cells may include a memory cell region A1 where memory cells are formed and a cell wiring region where cell wirings A2 are formed.

The second region may include regions C1 and C2 for forming memory cells and a region D1 for forming a common source contact. The region for forming the memory cells may include a memory cell region C1 where memory cells are formed and a cell wiring region C2 where cell wirings are formed.

Figure 12:
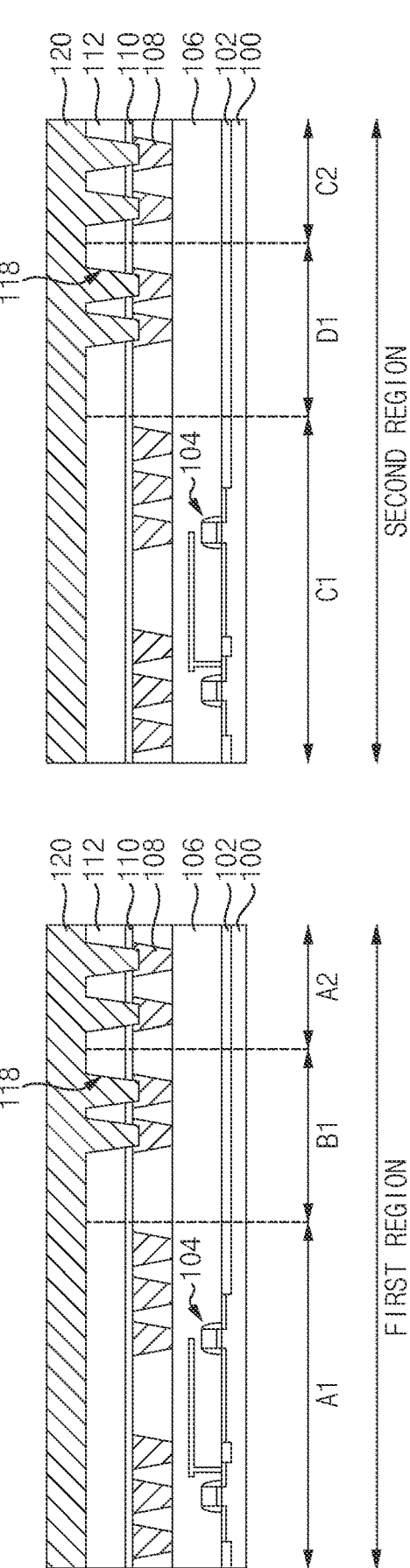

Referring to FIG. 12, portions of the second lower insulating interlayer 112 and the capping insulation layer 110 on the first and second regions may be etched to form via holes 118 exposing a portion of an uppermost lower wiring 108.

In example embodiments, the via holes 118 may be formed in source contact regions B1 and D1 where common source contacts are formed and the cell wiring regions A2 and C2 where cell wirings are formed on the first and second regions, respectively.

A first semiconductor layer 120 may be formed on the second lower insulating interlayer 112 in the first and second regions to fill the via holes 118. After forming the first semiconductor layer 120, an upper surface of the first semiconductor layer 120*a* may be planarized until the upper surface of the first semiconductor layer 120 may be substantially flat. The planarization process may include a chemical mechanical polishing (CMP) process. Accordingly, the first semiconductor layer 120 may cover the second lower insulating interlayer 112 on the first and second regions, and may be electrically connected to the lower wiring 108 exposed by the via hole 118.

In example embodiments, the first semiconductor layer 120 on the second region may be formed as a second sub-semiconductor pattern by subsequent processes. Therefore, the first semiconductor layer 120 may be formed to have a second thickness that is a target thickness of the second sub-semiconductor pattern.

In example embodiments, the first semiconductor layer 120 may include polysilicon doped with N-type impurities.

In example embodiments, a process for forming a barrier layer (not shown) may be further performed, before forming the first semiconductor layer 120. The barrier layer may include, e.g., titanium, titanium nitride, tantalum, tantalum nitride, or the like.

Figure 15:
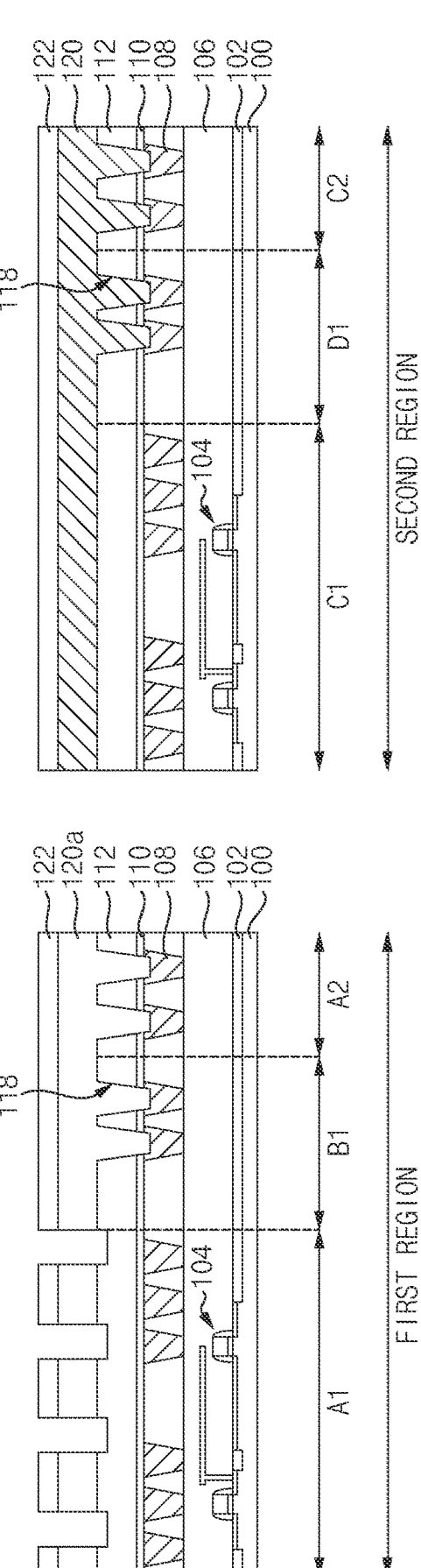

Referring to FIGS. 13 to 15, a first mask layer may be formed on the first semiconductor layer 120. In example embodiments, the first mask layer may include silicon oxide. For example, the first mask layer may include a TEOS layer.

The first mask layer on the first region may be selectively etched to form a first mask pattern 122. In the etching process, the first mask layer on the second region may not be etched, so that the first mask pattern 122 may selectively cover the first semiconductor layer 120 on the second region. Thereafter, the first semiconductor layer 120 on the first region and a portion of the second lower insulating interlayer 112 thereunder may be etched using the first mask pattern 122 as an etching mask. In this case, all of the first semiconductor layer 120 formed on the second lower insulating interlayer 112 in the first region may be removed. A lower contact plug 124 may be formed in the via hole 118 on the first region.

A first sub-semiconductor pattern formed by subsequent processes may have a thickness greater than a thickness of the second sub-semiconductor pattern by a thickness of an etched portion of the second lower insulating interlayer 112 on the first region. Accordingly, a thickness of the first sub-semiconductor pattern may be controlled by adjusting the etching thickness of the second lower insulating interlayer 112.

An exposed portion of the first mask pattern 122 may correspond to a portion having a first thickness greater than the second thickness in the first sub-semiconductor pattern formed by subsequent processes. Therefore, the first mask pattern 122 may selectively expose a portion having the first thickness (i.e., a first portion) in the first sub-semiconductor pattern.

In example embodiments, as shown in FIG. 13, the first mask pattern 122 may be formed to expose entire of the first region. In this case, the first sub-semiconductor pattern may be formed to have the first thickness in the entire of the first region by subsequent processes. Accordingly, the first sub-semiconductor pattern as shown in FIG. 4 may be formed.

In example embodiments, the first mask pattern 122 may be formed to expose only a portion of the first region. For example, as shown in FIG. 14, the first mask pattern 122 may expose only a central portion of the first region in the second direction. For example, the first mask pattern 122 may be formed to expose regions A1 and A2 for forming the memory cells. That is, the source contact region in the first region (e.g., edge portions B1 in the second direction) may be covered by the first mask pattern 122, and may not be exposed. Accordingly, the first semiconductor layer 120 covering the first mask pattern 122 may remain on the first region. In this case, as shown in FIG. 7, the first sub-semiconductor pattern may be formed to have the first thickness at the regions A1 and A2 for forming the memory cell in the first region by subsequent processes.

For example, as shown in FIG. 15, the first mask pattern 122 may have a line shape extending in one direction, and plurality of first mask patterns 122 may be arranged to be spaced apart from each other in the regions for forming memory cells A1 and A2 in the first region. The source contact region B1 in the first region may be covered by the first mask pattern 122, and may not be exposed by the first mask pattern 122. Accordingly, the first semiconductor layer 120 covering the first mask pattern 122 may remain on the first region. In this case, the first sub-semiconductor pattern may include a first portion having a line shape protruding from a bottom surface thereof, and the first portion of the first sub-semiconductor pattern may have the first thickness.

Hereinafter, subsequent processes using the first mask pattern shown in FIG. 13 will be described.

Referring to FIG. 16, a second semiconductor layer 130 may be formed on the second lower insulating interlayer 112, the lower contact plug 124 and the first mask pattern 122 on the first and second regions. An upper surface of the second semiconductor layer 130 may be formed to be higher than an upper surface of the first semiconductor layer 120.

The second semiconductor layer 130 may include a material the same as a material of the first semiconductor layer 120. In example embodiments, the second semiconductor layer 130 may include polysilicon doped with N-type impurities.

In example embodiments, an impurity concentration of the second semiconductor layer 130 may be the same as an impurity concentration of the first semiconductor layer 120. In some example embodiments, the second semiconductor layer 130 may include polysilicon having an impurity concentration higher than an impurity concentration of the first semiconductor layer 120. In this case, the first sub-semiconductor pattern formed by subsequent processes may have an impurity concentration higher than an impurity concentration of the second sub-semiconductor pattern.

Figure 17:
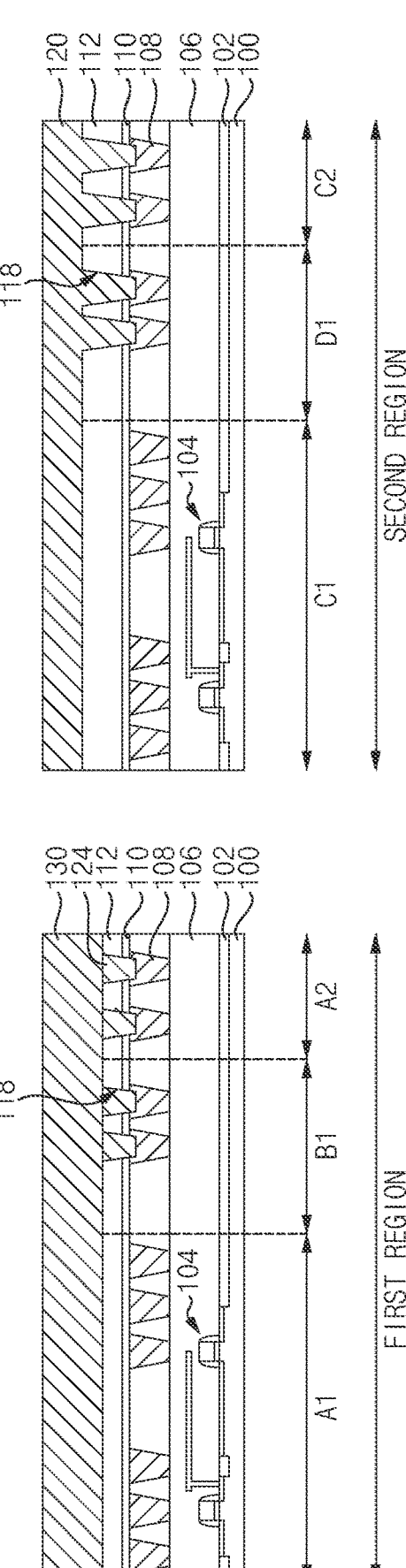

Referring to FIG. 17, the second semiconductor layer 130 and the first mask pattern 122 may be planarized until the upper surface of the first semiconductor layer 120 may be exposed.

By the planarization process, all of the first mask pattern 122 on the second region may be removed. When the planarization process is performed, the second semiconductor layer 130 may be formed on the first region, and the first semiconductor layer 120 may be formed on the second region. Upper surfaces of the first and second semiconductor layers 120 and 130 may be coplanar with each other, and upper surfaces of the first and second semiconductor layers 120 and 130 may be substantially flat. Since the first and second semiconductor layers 120 and 130 include the same material, the first and second semiconductor layers 120 and 130 may serve as one semiconductor layer.

A bottom of the second semiconductor layer 130 may be lower than a bottom of the first semiconductor layer 120. Accordingly, the second semiconductor layer 130 may have the first thickness greater than the second thickness.

Figure 18:
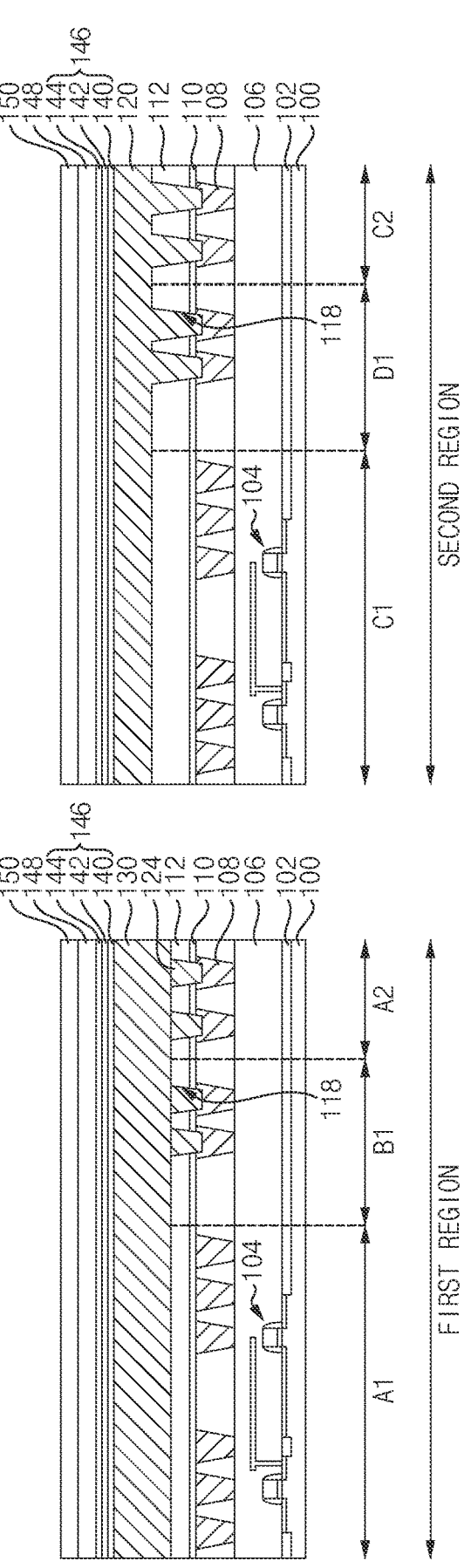

Referring to FIG. 18, a first lower sacrificial layer 140, a second lower sacrificial layer 142, and a third sacrificial layer 144 and a support layer 148 may be formed on the first and second semiconductor layers 120 and 130. A second mask layer 150 may be formed on the support layer 148.

The lower sacrificial layers may include a first sacrificial layer 140, a second sacrificial layer 152, and a third lower sacrificial layer 144 sequentially stacked. In this case, the first and third lower sacrificial layers 140 and 144 may include an oxide, e.g., silicon oxide, and the second lower sacrificial layer 142 may include nitride, e.g., silicon nitride. The support layer 148 may include a material having an etch selectivity with respect to the first to third lower sacrificial layers 140, 142 and 144, e.g., polysilicon. The polysilicon may be undoped with impurities or doped with N-type impurities. The second mask layer 150 may include silicon oxide. For example, the second mask layer 150 may include a TEOS layer.

Figure 19:
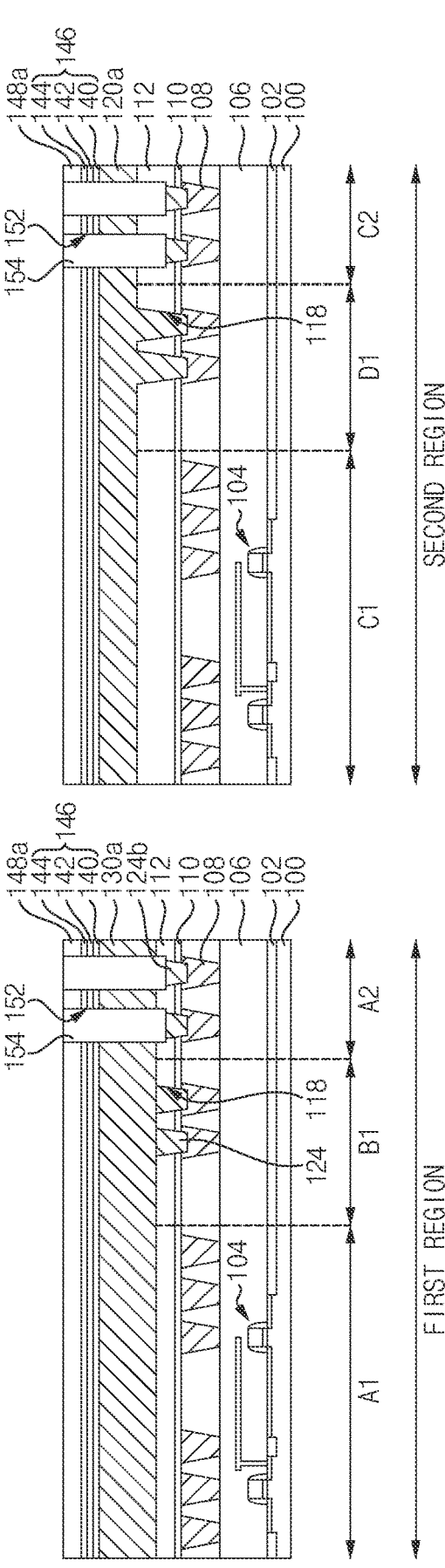

Referring to FIG. 19, the second mask layer 150 may be etched by a photolithography process to form a second mask pattern. The first to third lower sacrificial layers 140, 142 and 144, the support layer 148, the first and second semiconductor layers 120 and 130 and the second lower insulating interlayer 112 thereunder may be etched using the second mask pattern as an etch mask to form an opening 152.

Although not shown, the opening 152 may cut between the first and second semiconductor layers 120 and 130 at an interface of the first and second regions. Accordingly, the first sub-semiconductor pattern 130a may be formed on the first region, and the second sub-semiconductor pattern 120a may be formed on the second region. The first sub-semiconductor pattern 130a may have the first thickness, and the second sub-semiconductor pattern 120a may have the second thickness less than the first thickness. A lower sacrificial structure 146 and a support layer pattern 148a may be formed on the first and second sub-semiconductor patterns 130a and 120a.

By the etching process, the opening 152 may be formed through a portion for forming a through cell contact in the first and second sub-semiconductor patterns 130a and 120a. When the opening 152 is formed, an upper portion of an opposing lower contact plug 124 may be partially removed so that a protective pattern 124b being apart from the lower surfaces of the first and second sub-semiconductor patterns 130a and 120a may be formed. The protective pattern 124b may be connected to the lower wiring 108, and may protect the lower wiring 108 in an etching process for forming the through cell contact.

Thereafter, a lower insulation layer may be formed on the second mask pattern to fill the openings 152. The second mask pattern and the lower insulation layer may be planarized until an upper surface of the support layer pattern 148a may be exposed to form a lower insulation pattern 154 filling the openings 152.

In example embodiments, upper surfaces of the support layer pattern 148a and the lower insulation pattern 154 may be coplanar with each other, and upper surfaces of the support layer pattern 148a and the lower insulation pattern 154 may be substantially flat.

Hereinafter, processes for forming first and second cell structures and first and second common source contacts on the first and second sub-semiconductor patterns 130a and 120a will be described with reference to FIGS. 20 to 25. However, the processes for forming the first and second cell structures and the first and second common source contacts are not be limited thereto. The first and second cell structures formed on the first and second sub-semiconductor patterns may have the same structure, and may be formed by the same processes. Accordingly, processes for forming the first cell structure on the first sub-semiconductor pattern may be mainly described for conciseness.

Figure 20:
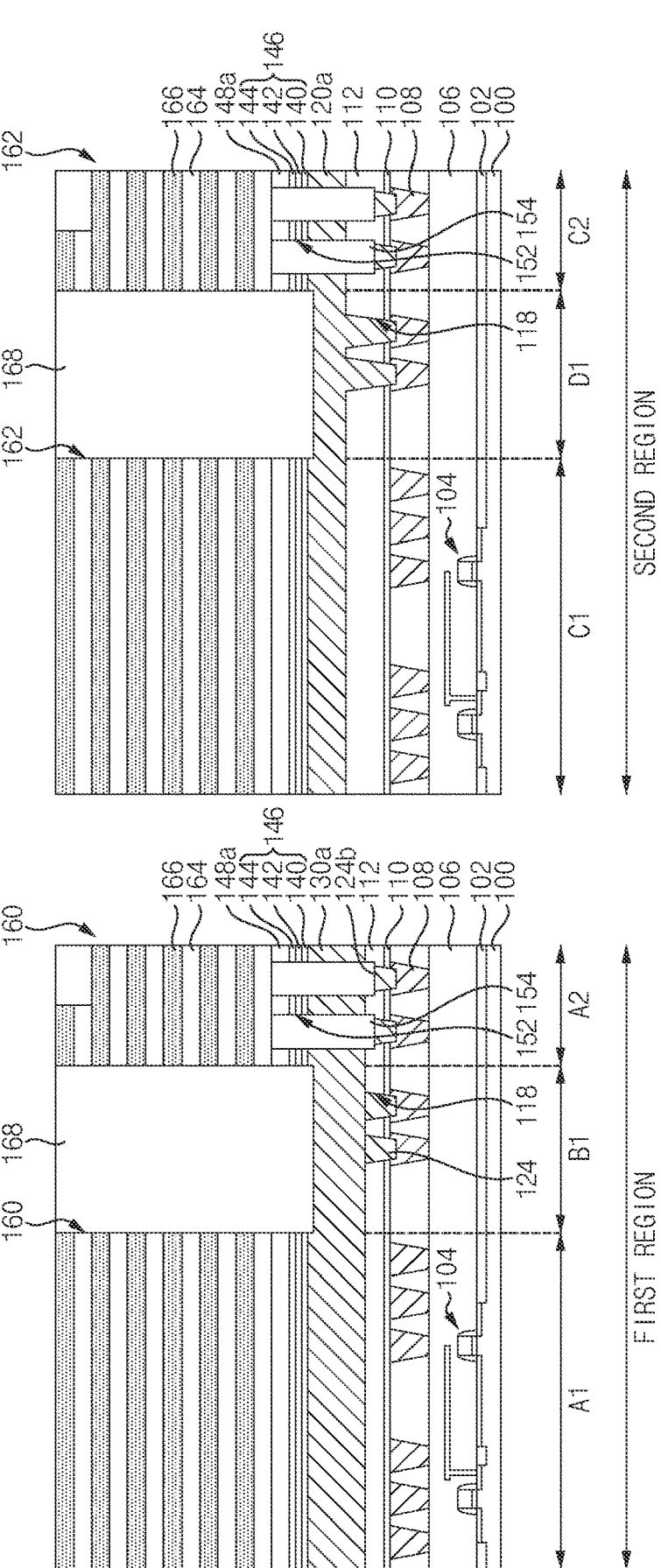

Referring to FIG. 20, a first mold structure 160 may be formed on the first sub-semiconductor pattern 130a. A second mold structure 162 may be formed on the second sub-semiconductor pattern 120a.

The first and second mold structures 160 and 162 may be formed into first and second cell structures, respectively, by subsequent processes. Therefore, the first and second mold structures 160 and 162 may not be formed on the source contact regions (e.g., edge portions in the second direction) B1 and D1 of the first and second sub-semiconductor patterns 130*a* and 120*a*.

In example embodiments, during an etching process for forming the first and second mold structures 160 and 162, the support layer pattern 148*a* and the lower sacrificial structure 146 on the source contact regions may be removed together. The first and second mold structures 160 and 162 may extend in the first direction.

The first and second mold structures 160 and 162 may have a structure in which a first insulation layer 164 and a first sacrificial layer 166 are alternately and repeatedly stacked. Edges of the first and second mold structures 160 and 162 in the first direction may have a stepped shape.

A first insulating interlayer 168 may be formed to cover sidewalls of the first and second mold structures 160 and 162. The first insulating interlayer 168 may include silicon oxide.

Figure 21:
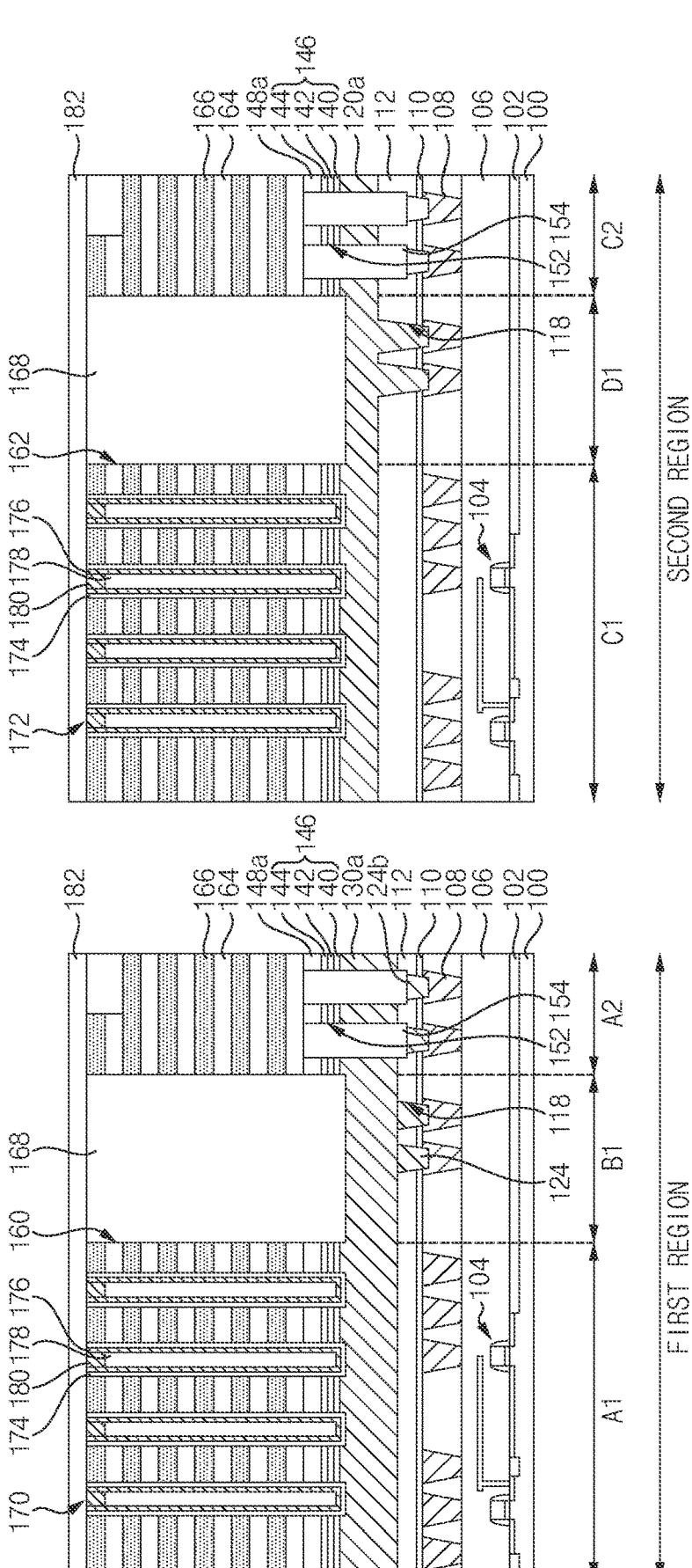

Referring to FIG. 21, first channel holes may be formed through the first mold structure 160, and may extend to an inner portion of the first sub-semiconductor pattern 130*a*. Second channel holes may be formed through the second mold structure 162, and may extend to an inner portion of the second sub-semiconductor pattern 120*a*.

A first preliminary channel structure 170 and a second preliminary channel structure 172 may be formed in the first and second channel holes, respectively. In example embodiments, each of the first and second preliminary channel structures 170 and 172 may include a charge storage structure 174, a channel 176, a filling insulation pattern 178 and a capping pattern 180. The charge storage structure 174 may include a first blocking layer, a charge storage layer, and a tunnel insulation layer sequentially stacked from a sidewall of each of the first and second channel holes.

A second insulating interlayer 182 may be formed on the first insulating interlayer 168 and the first and second preliminary channel structures 170 and 172.

Referring to FIG. 22, first holes 184 may be formed through the first and second insulating interlayers 168 and 182, stepped portions of the first mold structure 160 and the second mold structure 162, the lower insulation pattern 154 and the protective pattern 124*a*. The first holes 184 may extend into the lower wiring 108.

First sacrificial layers 166 exposed by the sidewall of the first hole 184 may be partially removed to form recesses communicating with the sidewall of the first hole 184. An uppermost recess communicating with the first holes 184 may be referred to as a first recess, and each of recesses under the first recess may be referred to as a second recess. A second insulation pattern 186 having a selectivity with respect to the first sacrificial layer 166 may be formed in each of second recesses.

A filling sacrificial pattern 190 may be formed in the first holes 184 and the first recess. The filling sacrificial pattern 190 may include, e.g., polysilicon. The filling sacrificial pattern 190 may fill the first hole 184, and a portion of a sidewall of the filling sacrificial pattern 190 may protrude laterally toward an uppermost first sacrificial layer. The filling sacrificial pattern 190 may be replaced to a through cell contact by subsequent processes.

Figure 23:
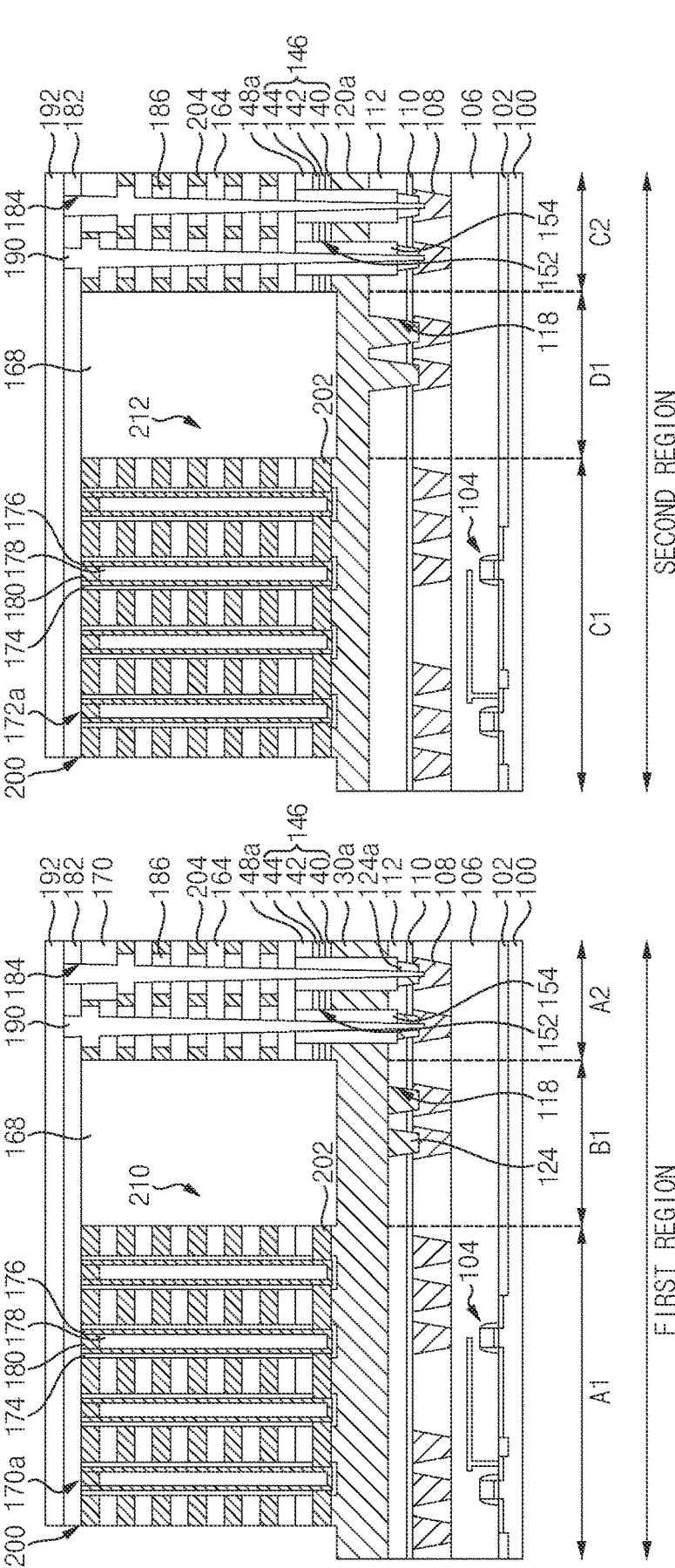

Referring to FIG. 23, a third insulating interlayer 192 may be formed on the second insulating interlayer 182 and the filling sacrificial pattern 190. An etching mask may be formed on the third insulating interlayer 192. The third insulating interlayer 192, the first and second insulating interlayers 168 and 182, the first mold structure 160, the support layer pattern 148*a* and the lower sacrificial layer structure 146 on the first region may be etched using the etching mask to form a trench 200 extending in the first direction. The third insulating interlayer 192, the first and second insulating interlayers 168 and 182, the second mold structure 162, the support layer pattern 148*a* and the lower sacrificial layer structure 146 on the second region may be etched to form the trench 200 extending in the first direction.

Thereafter, the lower sacrificial layer structure 146 may be selectively removed to form a first gap (not shown). Next, the charge storage structure exposed by the first gap may be etched so that a lower portion of the channel 176 may be exposed. Accordingly, a first channel structure 170*a* may be formed in the first channel hole, and a second channel structure 172*a* may be formed in the second channel hole.

A channel connection pattern 202 may be formed to fill the first gap. Channels 176 of neighboring first channel structures 170*a* and the first sub-semiconductor pattern 130*a* may be electrically connected to each other by the channel connection pattern 202. Channels 176 of neighboring the second channel structures 172*a* and the second sub-semiconductor pattern 120*a* may be electrically connected to each other by the channel connection pattern 202. The channel connection pattern 202 may include polysilicon doped with N-type impurities.

The first sacrificial layers 166 exposed by sidewalls of the trench 200 may be removed to form second gaps. A first barrier metal layer (not shown) may be conformally formed on a surface of the second gaps, and a gate conductive layer may be formed on the first barrier metal layer to fill the second gaps. Thereafter, portions of the first barrier metal layer and the gate conductive layer may be removed to form a gate pattern 204 in each of the second gaps. The gate pattern 204 may include a first barrier metal pattern and a first metal pattern. The first barrier metal layer may include, e.g., titanium, titanium nitride, tantalum, or tantalum nitride. The gate conductive layer may include a metal material, e.g., tungsten, copper, or aluminum.

Accordingly, a first pattern structure 210 including the first insulation layer 164 and the gate pattern 204 alternately and repeatedly stacked may be formed on the first region. The first pattern structure 210 may extend in the first direction, and may have a stepped shape at the edge in the first direction. A first cell structure including the first pattern structure 210, the first channel structure 170*a* and the channel connection pattern 202 may be formed on the first region. A second pattern structure 212 including the first insulation layer 164 and the gate pattern 204 alternately and repeatedly stacked may be formed on the second region. The second pattern structure 212 may extend in the first direction, and may have a stepped shape at the edge in the first direction. A second cell structure including the second pattern structure 212, the second channel structure 172*a* and the channel connection pattern 202 may be formed on the second region.

Figure 24:
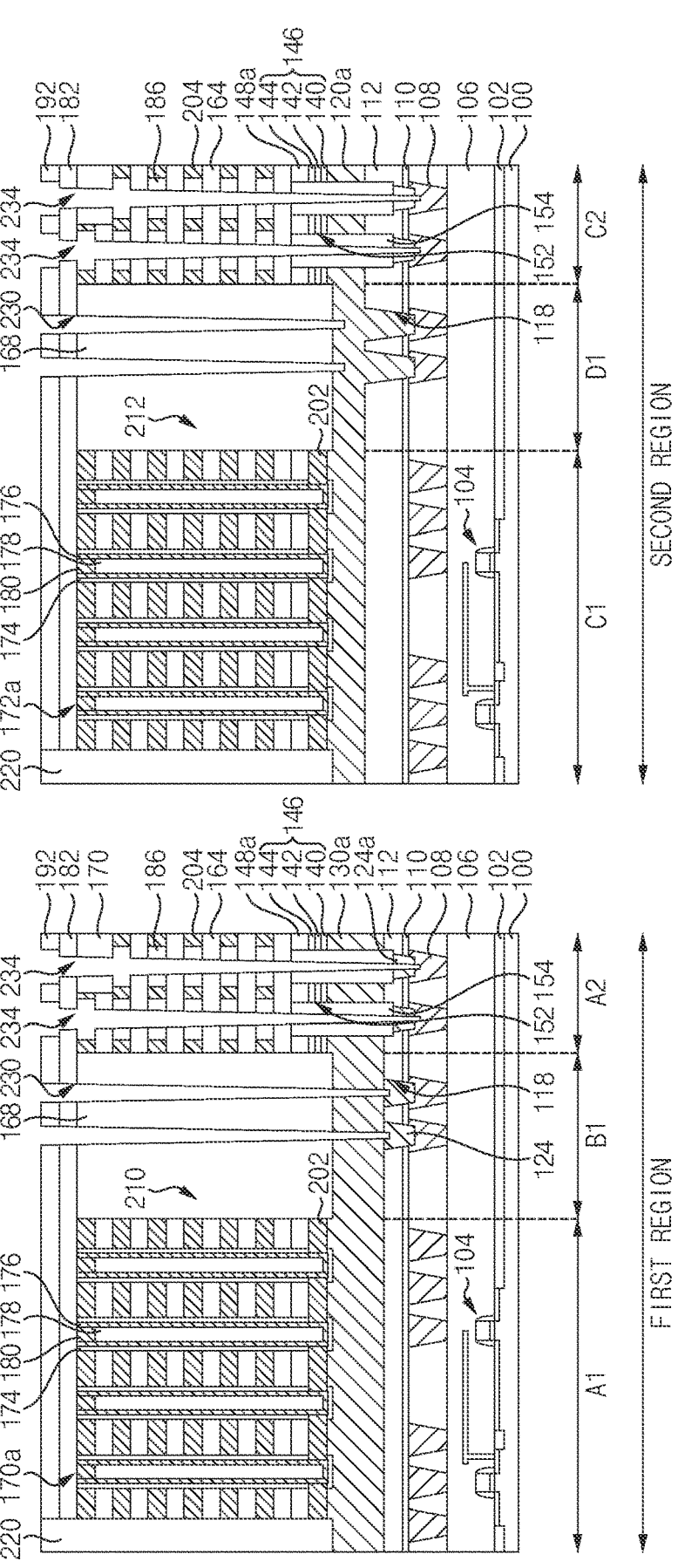

Referring to FIG. 24, an insulation pattern 220 may be formed to fill the trench 200.

The third insulating interlayer 192, the second insulating interlayer 182, and the first insulating interlayer 168 may be etched to form a common source contact hole 230 at the source contact region in the first and second regions. In some example embodiments, during the etching process, the first and second sub-semiconductor patterns 130*a* and 120*a* under the first insulating interlayer 168 may be etched together.

The third insulating interlayer 192 over the first hole 184 may be partially etched to form an upper opening. Thereafter, the filling sacrificial pattern 190 in the first hole 184 may be selectively removed to form a second hole 234 including the upper opening and the first hole 184. The selective removing process may include wet etching process.

When the etching process is performed, a sidewall of an uppermost gate pattern 204 among the gate patterns penetrated the second hole 234 may be exposed by the second hole 234. On the other hand, sidewalls of the gate patterns 204 positioned under the uppermost gate pattern 204 may not be exposed the second hole 234.

Figure 25:
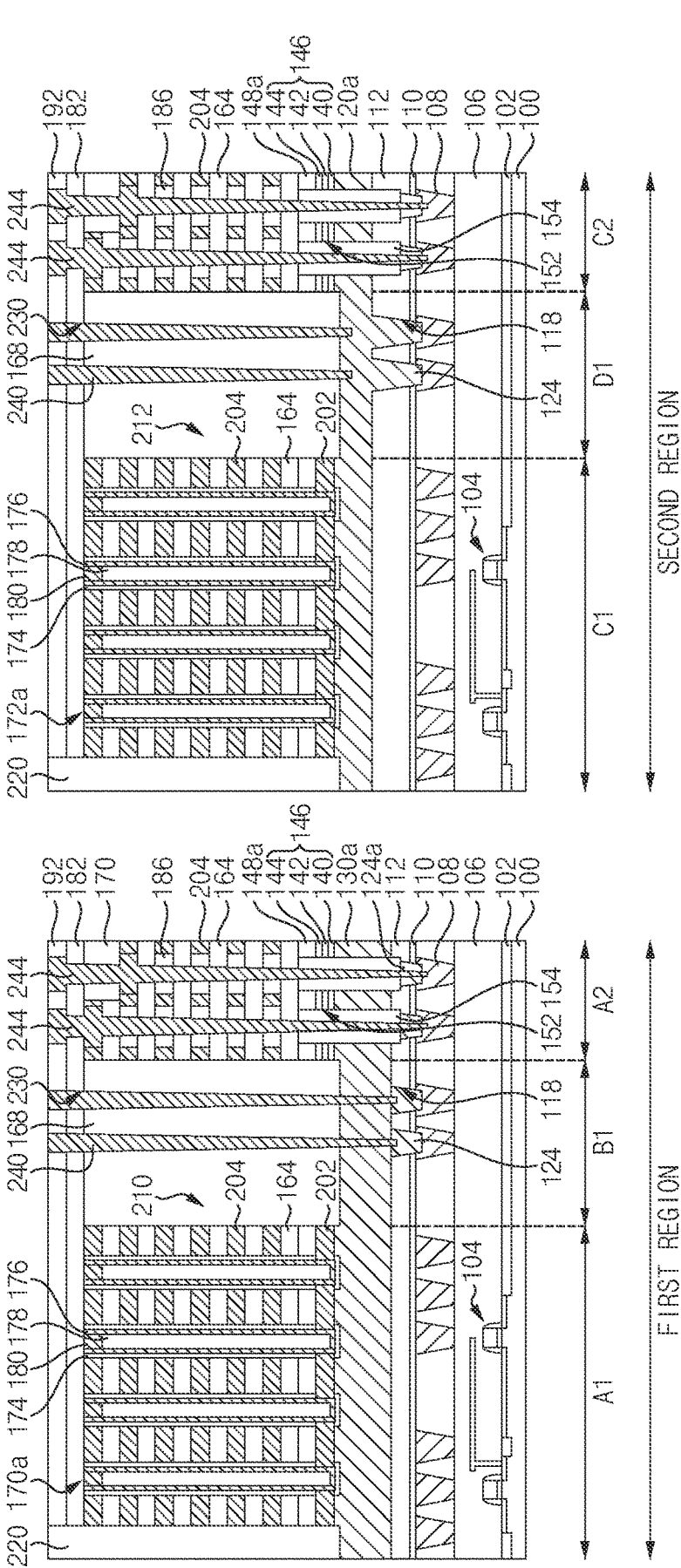

Referring to FIG. 25, a conductive layer may be formed on the third insulating interlayer 296 to fill the common source contact hole 230 and the second hole 234.

The conductive layer may include a second barrier metal layer and a metal layer. The second barrier metal layer may include, e.g., titanium, titanium nitride, tantalum, or tantalum nitride. The second metal layer may include a metal material, e.g., tungsten, copper, or aluminum.

Thereafter, the conductive layer may be polished until an upper surface of the third insulating interlayer 296 may be exposed. Accordingly, a first common source contact 240 may be formed in the common source contact hole 230 of the first region, and a second common source contact 242 may be formed in the common source contact hole 230 of the second region.

A through cell contact 244 may be formed in the second hole 234. The first and second common source contact and the through cell contact 244 may include a second bather metal layer pattern and a second metal pattern.

The through cell contact 244 may include a first through portion penetrating the first and second cell structures 350 and a first protrusion laterally protruding from a sidewall of the first through portion. An end of the first protrusion may contact a sidewall of an uppermost gate pattern 204 adjacent to the first through portion.

Thereafter, upper insulating interlayers may be formed to cover the third insulating interlayer 192, the first and second common source contacts 240 and 242 and the through cell contact 244. Upper wirings electrically connected to the first and second channel structures 170*a* and 172*a*, the first and second common source contacts 240 and 242, and the through cell contact 244, respectively, further formed on the upper insulating interlayer.

As described above, the first and second sub-semiconductor patterns may be formed to include the same material.

FIGS. 26 to 30 are cross-sectional views illustrating a method of manufacturing a vertical memory device according to example embodiments.

The vertical memory device described below may be formed by the same processes as described with reference to FIGS. 10 to 25, except for the processes for forming the first and second sub-semiconductor patterns. Accordingly, only the processes for forming the first and second sub-semiconductor patterns will be described for conciseness.

In each of figures, the cross-sectional view on the left is a structure on the first region, and the cross-sectional view on the right is a structure on the second region.

Referring to FIG. 26, circuit patterns constituting peripheral circuits may be formed on the first and second regions of the substrate 100. The first lower insulation layer 106, the capping insulation layer 110, and the second lower insulating interlayer 112 may be formed to cover the peripheral circuits.

Portions of the second lower insulating interlayer 112 and the capping insulation layer 110 on the first and second regions may be etched to form the via holes 118 exposing a portion of the uppermost lower wiring 108.

The first semiconductor layer 120 may be formed on the second lower insulating interlayer 112 in the first and second regions to fill the via holes 118.

Referring to FIG. 27, the first semiconductor layer 120 may be planarized until an upper surface of the second lower insulating interlayer 112 may be exposed. The planarization process may include a chemical mechanical polishing process. Accordingly, the first semiconductor layer 120 may remain only in the via hole 118. The first semiconductor layer 120 may be formed as a lower contact 121 and a protective pattern 124*b*.

In example embodiments, the first semiconductor layer 120 may include polysilicon doped with N-type impurities.

Referring to FIG. 28, a third lower insulating interlayer 126 may be formed on the second lower insulating interlayer 112. At least a portion of the third lower insulating interlayer 126 on the first region may be etched to form an opening 128*a* and a via hole 128*b*. A portion of the third lower insulating interlayer 126 may be etched to form via holes 128*b* at the source contact region D1 on the second region.

In example embodiments, the third lower insulating interlayer 126 corresponding to a portion of the first sub-semiconductor pattern having the first thickness on the first region may be selectively etched to form the opening 128*a*. For example, an opening 128*a* may be formed in the third lower insulating interlayer 126 at the memory cell region A1 on the first region. For example, the opening 128*a* may have a line shape, and a plurality of openings may be spaced apart from each other. In this case, the first sub-semiconductor pattern as shown in FIG. 8 may be formed by subsequent processes.

The via holes 128*b* may be formed on the source contact region B1 in the first region. In example embodiments, the opening 128*a* may not be formed on the cell wiring region A2 for forming the through cell contact on the first region.

The openings 128*a* may not be formed in the third lower insulating interlayer 126 for forming a cell structure on the second region.

An upper surface of the third lower insulating interlayer 126 may have a height difference as much as a depth of the opening 128*a*.

Referring to FIG. 29, a second semiconductor layer 130 may be formed on the third lower insulating interlayer 126 to fill the opening 128*a* and the via holes 128*b*. An upper surface of the second semiconductor layer 130 may be planarized until the upper surface of the second semiconductor layer 130 may be flat. After the planarization process, the third lower insulating interlayer 126 may not be exposed. Thus, the second semiconductor layer 130 may cover an entire surface of the third lower insulating interlayer 126.

In example embodiments, the second semiconductor layer 130 may include polysilicon doped with N-type impurities.

In some example embodiments, only the second semiconductor layer 130 formed on the first region may be additionally doped with N-type impurities. In this case, the second semiconductor layer 130 formed on the first region may have an impurity concentration higher than an impurity concentration of the second semiconductor layer 130 formed on the second region.

An upper surface of the second semiconductor layer 130 on the first region and an upper surface of the second semiconductor layer 130 on the second region may be coplanar with each other, and the upper surface of the second semiconductor layer 130 on the first region and the upper surface of the second semiconductor layer 130 on the second region may be substantially flat.

Since the second semiconductor layer 130 is formed in the opening 128a and the via hole 128b, lower surfaces of the second semiconductor layers 130 on the first and second regions may not be flat. The second semiconductor layer 130 on the first region may have a first thickness, and the second semiconductor layer 130 on the second region may have a second thickness less than the first thickness.

Figure 30:
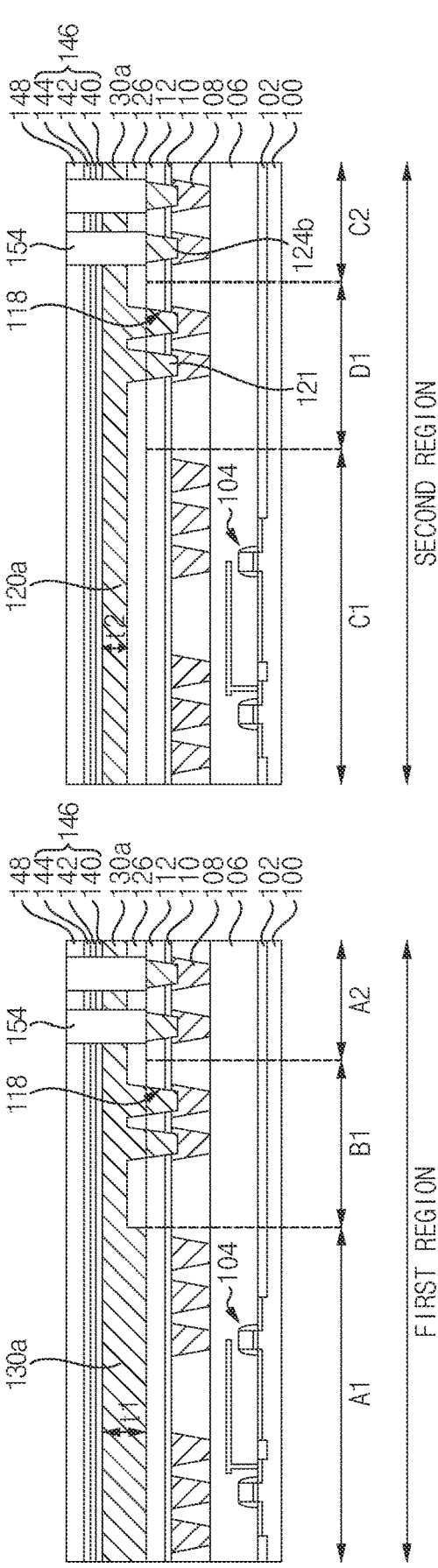

Referring to FIG. 30, the lower sacrificial layers and the support layer may be formed on the second semiconductor layer 130. The second mask pattern may be formed on the support layer. Portions of the lower sacrificial layers, the support layer, the second semiconductor layer 130 and the third lower insulating interlayer 126 thereunder may be etched by using the second mask pattern as an etch mask to form the second opening. The lower sacrificial structure 146 and the support layer pattern 148a may be formed on the first and second sub-semiconductor patterns 130a and 120a.

The second opening may cut the second semiconductor layer 130 between the first and second regions. Accordingly, the first sub-semiconductor pattern 130a may be formed on the first region, and the second sub-semiconductor pattern 120a may be formed on the second region. The first sub-semiconductor pattern 130a may have the first thickness t1, and the second sub-semiconductor pattern 120a may have the second thickness t2 less than the first thickness t1.

By the etching process, the second openings may be formed on the cell wiring region for forming the first and second through cell contacts in the first and second sub-semiconductor patterns 130a and 120a.

The lower insulation layer may be formed on the mask pattern to fill the second openings. The second mask pattern and the lower insulation layer may be planarized until an upper surface of the support layer pattern 148a may be exposed to form the lower insulation pattern 154 in the second openings.

Thereafter, a vertical memory device may be manufactured by performing the same processes as the processes described with reference to FIGS. 20 to 25.

As described above, the first and second sub-semiconductor patterns may be formed to include the same material.

Figure 32:
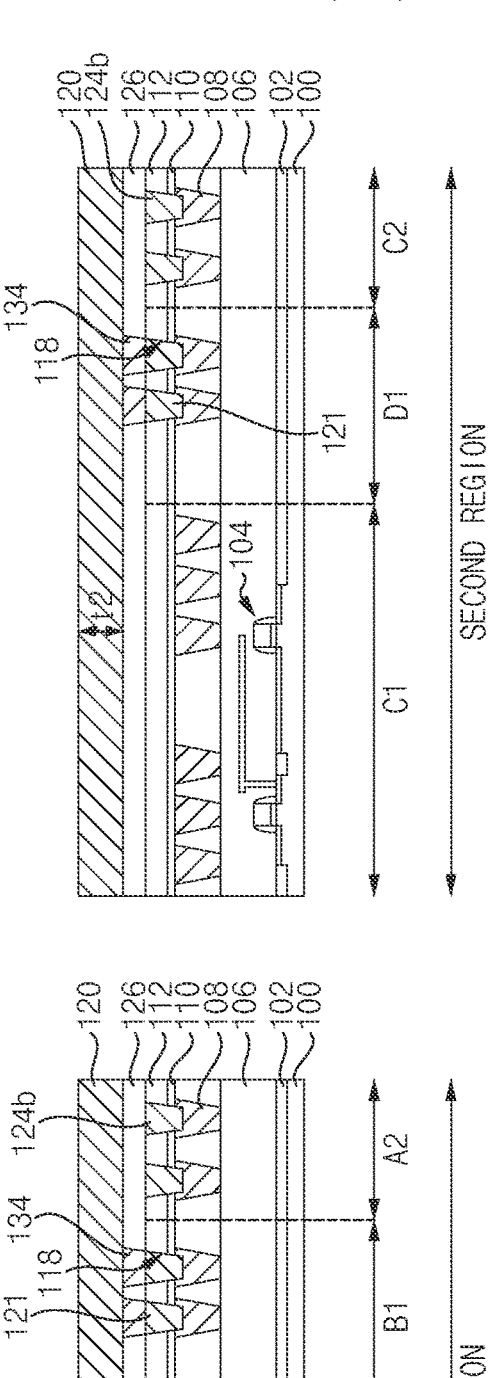
Figure 33:
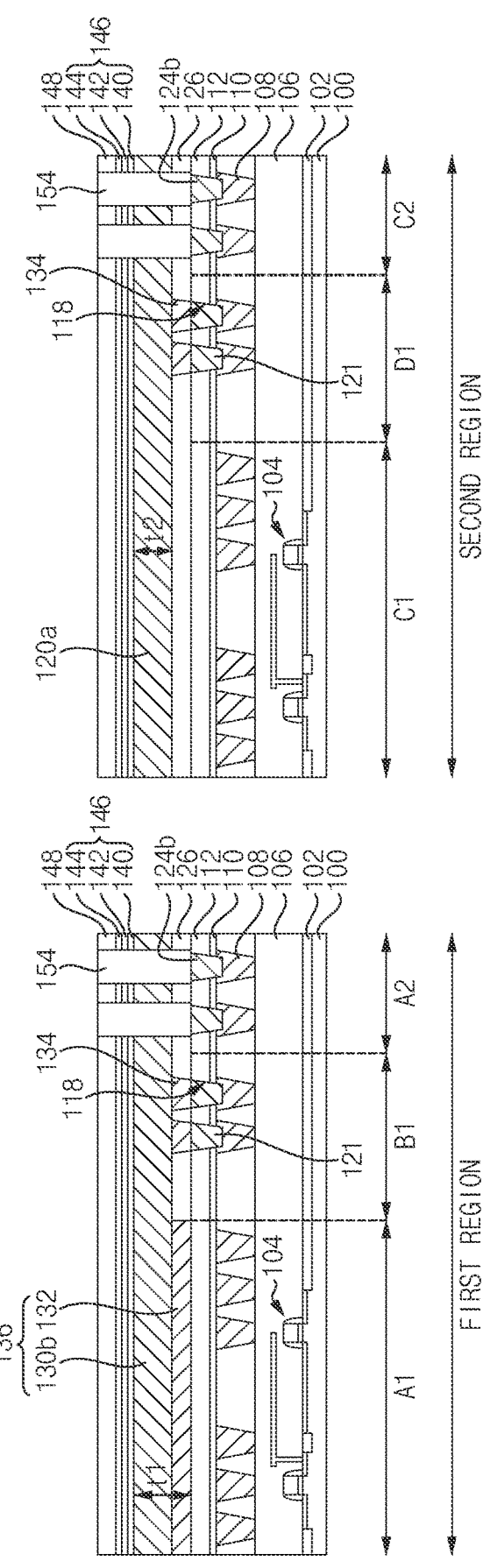

FIGS. 31 to 33 are cross-sectional views illustrating a method of manufacturing a vertical memory device according to example embodiments.

A vertical memory device described below may be formed by the same processes as described with reference to FIGS. 10 to 25, except for the processes for forming the first and second sub-semiconductor patterns. Accordingly, only the processes for forming the first and second sub-semiconductor patterns will be described for conciseness.

In each of figures, the cross-sectional view on the left is a structure on the first region, and the cross-sectional view on the right is a structure on the second region.

First, the structure shown in FIG. 28 may be formed by performing the processes described with reference to FIGS. 26 to 28.

Referring to FIG. 31, a conductive layer may be formed on the third lower insulating interlayer 126 to fill the opening 128a and the via holes 128b. In example embodiments, the conductive layer may include a metal material. The metal material may include, e.g., tungsten, copper, or aluminum.

In some example embodiments, the conductive layer may include heavily doped polysilicon.

An upper portion of the conductive layer may be planarized until an upper surface of the third lower insulating interlayer 126 may be exposed to form a lower conductive pattern 132 in the opening 128a and a via contact 134 in the via hole 128b.

The lower conductive pattern 132 may be formed on the memory cell region in the first region. The lower conductive pattern 132 may not be formed on the second region.

Referring to FIG. 32, the first semiconductor layer 120 may be formed on the third lower insulating interlayer 126 and the lower conductive pattern 132. The first semiconductor layer 120 may have the second thickness t2.

Referring to FIG. 33, the lower sacrificial layers and the support layer may be formed on the first semiconductor layer 120. The second mask pattern may be formed on the support layer. Portions of the lower sacrificial layers, the support layer, the first semiconductor layer 120 and the third lower insulating interlayer 126 thereunder may be etched using the second mask pattern as an etch mask to form a second opening.

The second opening may cut the first semiconductor layer 120 between the first and second regions. Accordingly, a first sub-semiconductor pattern 130b may be formed on the first region, and a second sub-semiconductor pattern 120a may be formed on the second region.

By the etching process, the second openings may be formed in portions for forming first and second through cell contacts of the first and second sub-semiconductor patterns 130b and 120a.

The lower conductive pattern 132 may be formed directly on a lower surface of the first sub-semiconductor pattern 130b. The first sub-semiconductor pattern 130b and the lower conductive pattern 132 may serve as a first sub-semiconductor structure 136.

Since the lower conductive pattern 132 is formed, a resistance of the first sub-semiconductor structure 136 may be decreased. At least a portion of the first sub-semiconductor structure 136 may have the first thickness t1. Each of the first and second sub-semiconductor patterns 130b and 120a may have the second thickness t2 less than the first thickness t1.

The lower sacrificial structure 146 and the support layer pattern 148a may be formed on the first sub-semiconductor structure 136 and the second sub-semiconductor pattern 120a. The lower insulation pattern 154 may be formed in the second opening formed by the etching process.

Thereafter, a vertical memory device may be manufactured by performing the same processes as the processes described with reference to FIGS. 20 to 25.

Hereinafter, examples of sub-semiconductor patterns of a vertical semiconductor device including three or more regions in one MAT region will be described. The vertical memory device described below may be the same as that described with reference to FIGS. 1 to 6, except for the sub-semiconductor pattern. Therefore, the sub-semiconductor pattern will be mainly described for conciseness.

Figure 34:
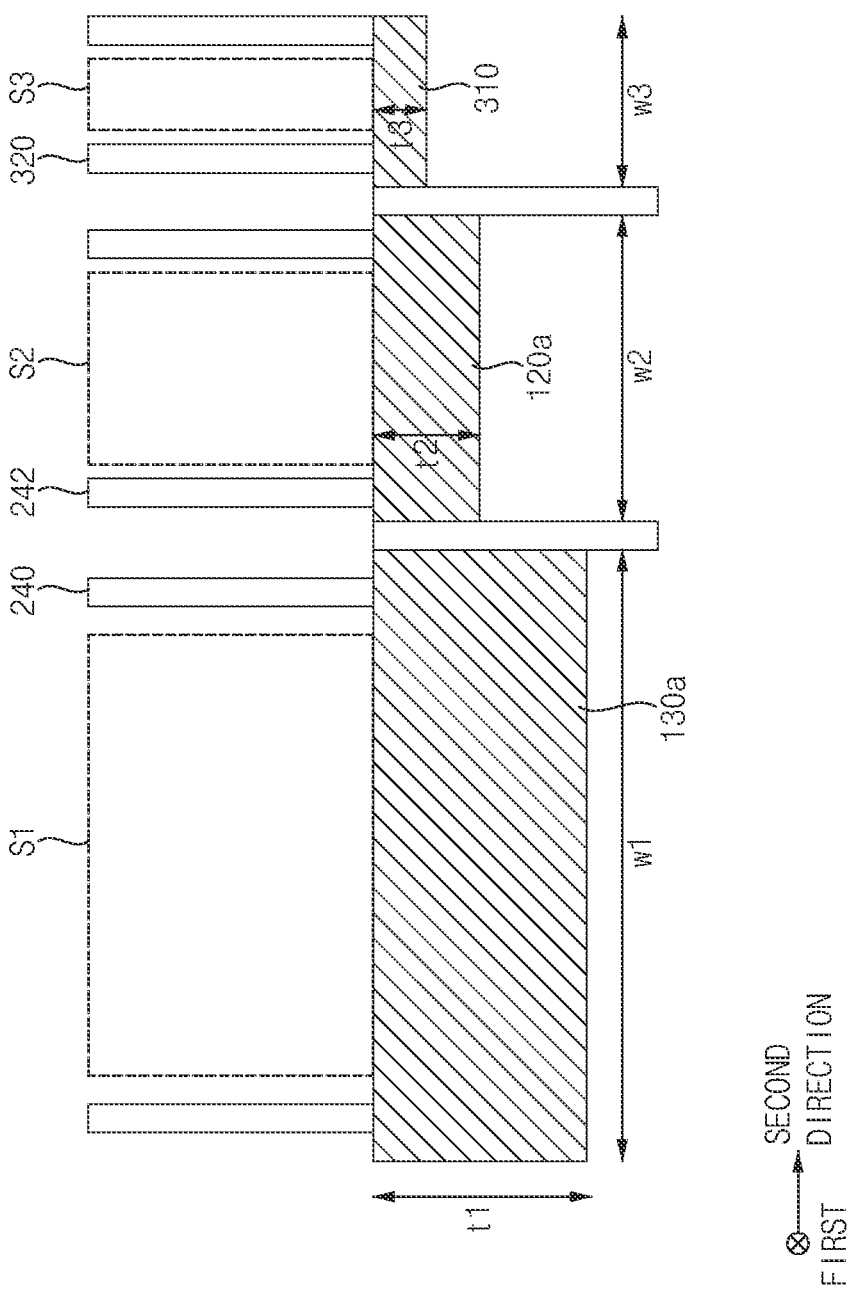
FIG. 34 is a cross-sectional view illustrating sub-semiconductor patterns in a vertical memory device according to example embodiments.

FIG. 34 is a cross-sectional view illustrating sub-semiconductor patterns in a vertical memory device according to an example embodiment.

Referring to FIG. 34, a plurality of regions may be included in the MAT region of the substrate. For example, as shown in FIG. 34, first to third regions may be included in the MAT region.

The first region may have a first width W1 in the second direction. The second region may have a second width W2 in the second direction that is less than the first width W1 in the second direction, and the third region may have a third width W3 in the second direction that is less than the second width W2 in the second direction. Accordingly, the first region may have a size larger than a size of the second region, and the second region may have a size larger than a size of the third region. That is, the length of the first to third regions may be the same such that the first region may have an area larger than an area of the second region, and the second region may have an area larger than an area of the third region A first sub-semiconductor pattern 130a may be formed on the first region, a second sub-semiconductor pattern 120a may be formed on the second region, and a third sub-semiconductor pattern 310 may be formed on the third region.

First common source contacts 240 and a first cell structure S1 may be formed on the first sub-semiconductor pattern 130a. Second common source contacts 242 and a second cell structure S2 may be formed on the second sub-semiconductor pattern 120a. Third common source contacts 320 and a third cell structure S3 may be formed on the third sub-semiconductor pattern 310.

The first sub-semiconductor pattern 130a may have the first width W1 in the second direction. The second sub-semiconductor pattern 120a may have the second width W2, and the third sub-semiconductor pattern 219 may have the third width W3 in the second direction.

A difference between resistances of the first to third sub-semiconductor patterns 130a, 120a, and 310 may be decreased. In some example embodiments, the first to third sub-semiconductor patterns 130a, 120a, and 310 may have the same or similar resistance. Upper surfaces of the first to third sub-semiconductor patterns 130a, 120a, and 310 may be coplanar with each other, and upper surfaces of the first to third sub-semiconductor patterns 130a, 120a, and 310 may be substantially flat.

At least a portion of the first sub-semiconductor pattern 130a may have a first thickness t1. At least a portion of the second sub-semiconductor pattern 120a may have a second thickness t2 less than the thickness of the first sub-semiconductor pattern 130a. The third sub-semiconductor pattern 310 may have a third thickness t3 less than the thickness of the second sub-semiconductor pattern 120a.

In example embodiments, the first sub-semiconductor pattern 130a may have the first thickness t1 on an entirety of the first region. In some example embodiments, one portion of the first sub-semiconductor pattern 130a may have the first thickness t1, and other portion of the first sub-semiconductor pattern 130a may have the second thickness t2.

In example embodiments, the second sub-semiconductor pattern 120a may have the second thickness t2 on an entirety of second region. In some example embodiments, one portion of the second sub-semiconductor pattern 120a may have the second thickness t2, and the other portion of the second sub-semiconductor pattern 120a may have the third thickness t3.

In example embodiments, the third sub-semiconductor pattern 310 may have the third thickness t3 on an entirety of the third region.

As such, a plurality of regions may be included in the MAT region of the substrate, and the sub-semiconductor patterns on each of regions may have different thicknesses. Therefore, a difference between resistances of the sub-semiconductor patterns may be decreased.

Figure 35:
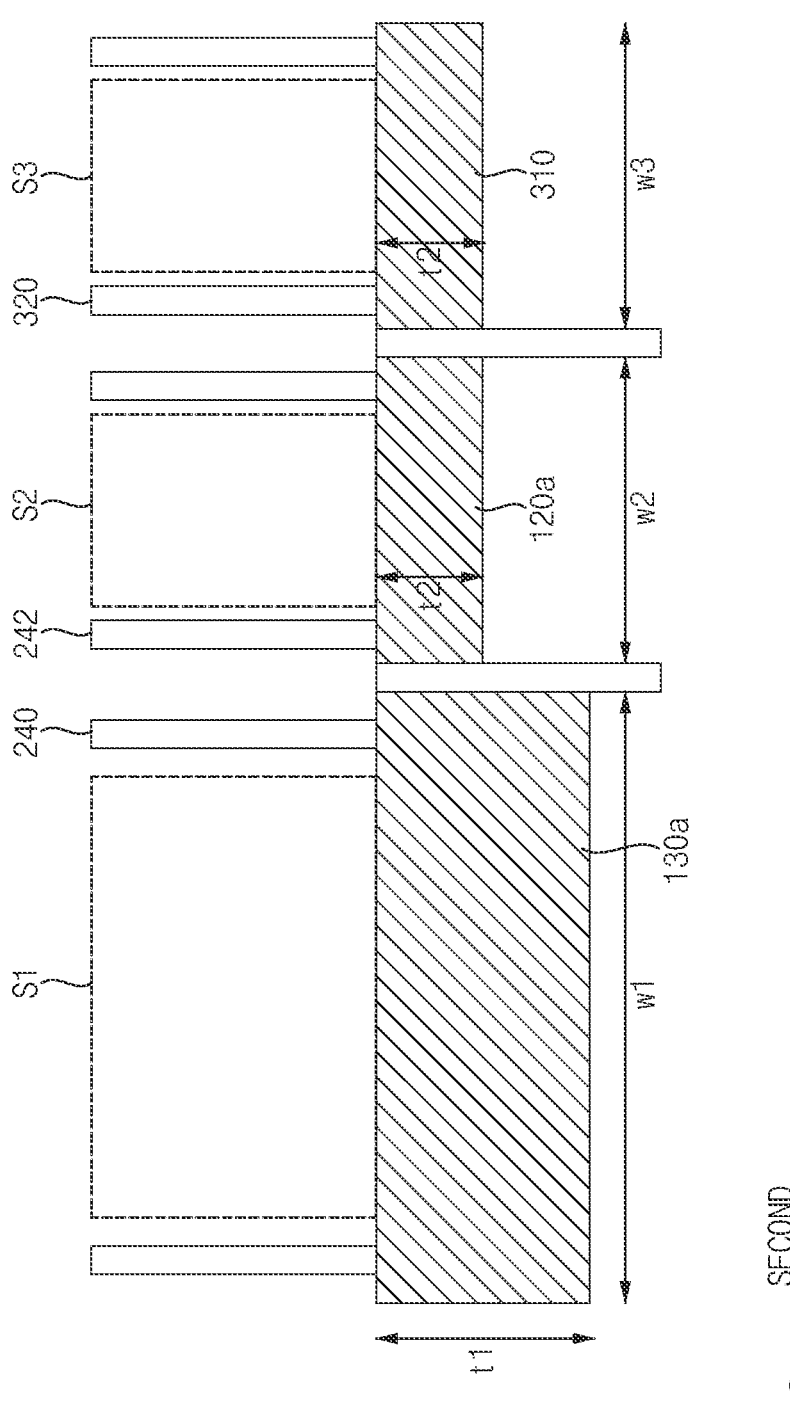
FIG. 35 is a cross-sectional view illustrating sub-semiconductor patterns in a vertical memory device according to example embodiments.

FIG. 35 is a cross-sectional view illustrating sub-semiconductor patterns in a vertical memory device according to example embodiments.

Referring to FIG. 35, a plurality of regions may be included in the MAT region of the substrate. For example, first to third regions may be included in the MAT region.

The first region may have a first width W1 in the second direction. The second region may have a second width W2 in the second direction that is less than the first width W1 in the second direction, and the third region may have a third width W3 in the second direction that is equal to or similar to the second width W2 in the second direction.

A first sub-semiconductor pattern 130a may be formed on the first region, a second sub-semiconductor pattern 120a may be formed on the second region, and a third sub-semiconductor pattern may be formed on the third region.

First common source contacts 240 and a first cell structure S1 may be formed on the first sub-semiconductor pattern 130a. Second common source contacts 242 and a second cell structure S2 may be formed on the second sub-semiconductor pattern 120a. Third common source contacts 320 and a third cell structure S3 may be formed on the third sub-semiconductor pattern 310.

The first sub-semiconductor pattern 130a may have the first width W1 in the second direction. The second sub-semiconductor pattern 120a may have the second width W2 in the second direction, and the third sub-semiconductor pattern 310 may have the third width W3 in the second direction.

At least a portion of the first sub-semiconductor pattern 130a may have a first thickness t1. At least portions of the second and third sub-semiconductor patterns 120a and 310 may have a second thickness t2 less than the thickness of the first sub-semiconductor pattern 130a.

In example embodiments, the first sub-semiconductor pattern 130a may have the first thickness t1 in an entirety of the first region. The second and third sub-semiconductor patterns 120a and 310 may have the second thickness t2 less than the thickness of the first sub-semiconductor pattern 130a. The second and third sub-semiconductor patterns 120a and 310 may have the second thickness t2 in an entire of the second and third regions.

In some example embodiments, one portion of the first sub-semiconductor pattern 130a may have the first thickness t1, and the other portion of the first sub-semiconductor pattern 130a may have the second thickness t2. The second and third sub-semiconductor patterns 120a and 310 may have the second thickness t2 in an entirety of the second and third regions.

As described above, only the first sub-semiconductor pattern 130a formed on the first region having a widest width may have a relatively thick thickness. The sub-semiconductor patterns formed in the second and third regions having the same or similar widths may have the same thickness.

Figure 36:
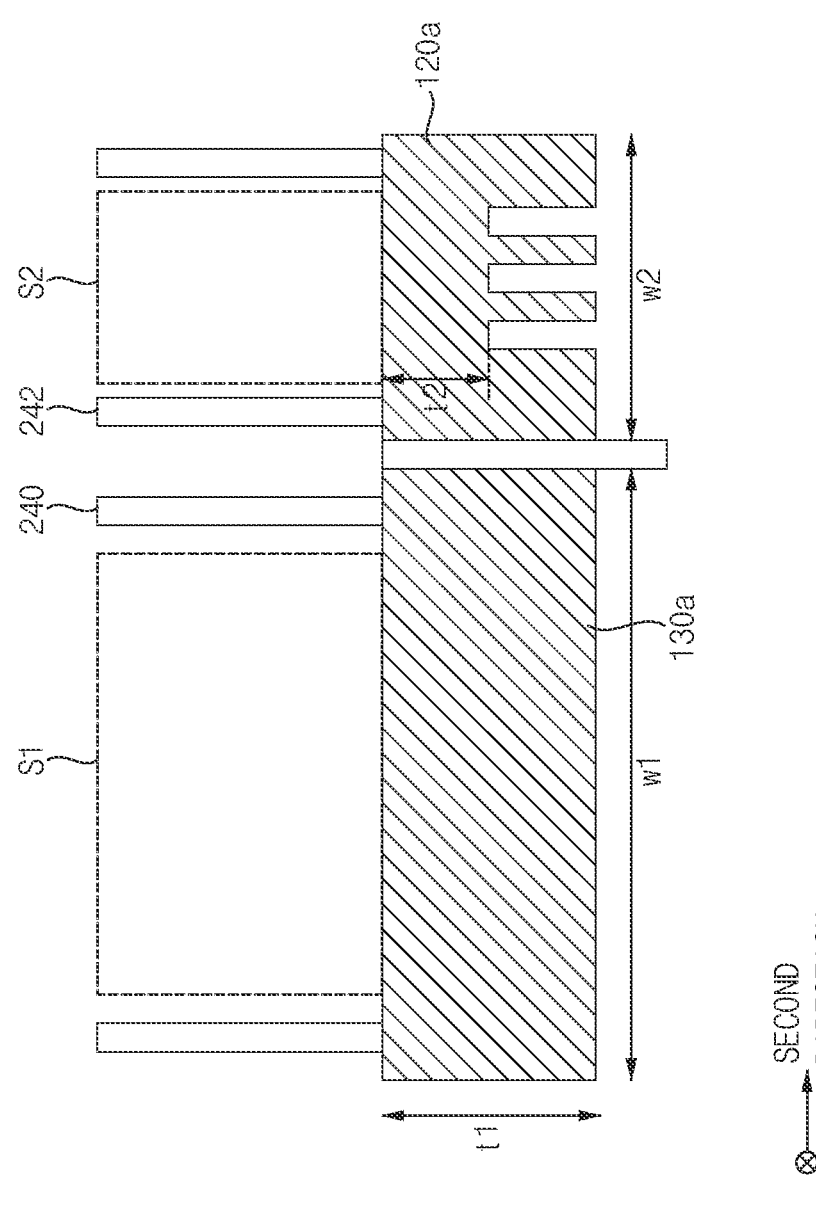
FIG. 36 is a cross-sectional view illustrating sub-semiconductor patterns in a vertical memory device according to example embodiments.

FIG. 36 is a cross-sectional view illustrating sub-semiconductor patterns in a vertical memory device according to example embodiments.

Referring to FIG. 36, first and second regions may be included in the MAT region of the substrate.

The first region may have a first width W1 in the second direction. The second region may have a second width W2 in the second direction that is less than the first width in the second direction.

The first sub-semiconductor pattern 130a may have a first thickness t1 in an entirety of the first region. One portion of the second sub-semiconductor pattern 120a on the second region may have the first thickness t1, and the other portion of the second sub-semiconductor pattern 120a on the second region may have a second thickness t2 less than the first thickness t1.

First common source contacts 240 and a first cell structure S1 may be formed on the first sub-semiconductor pattern 130a. Second common source contacts 242 and a second cell structure S2 may be formed on the second sub-semiconductor pattern 120a.

Figure 37:
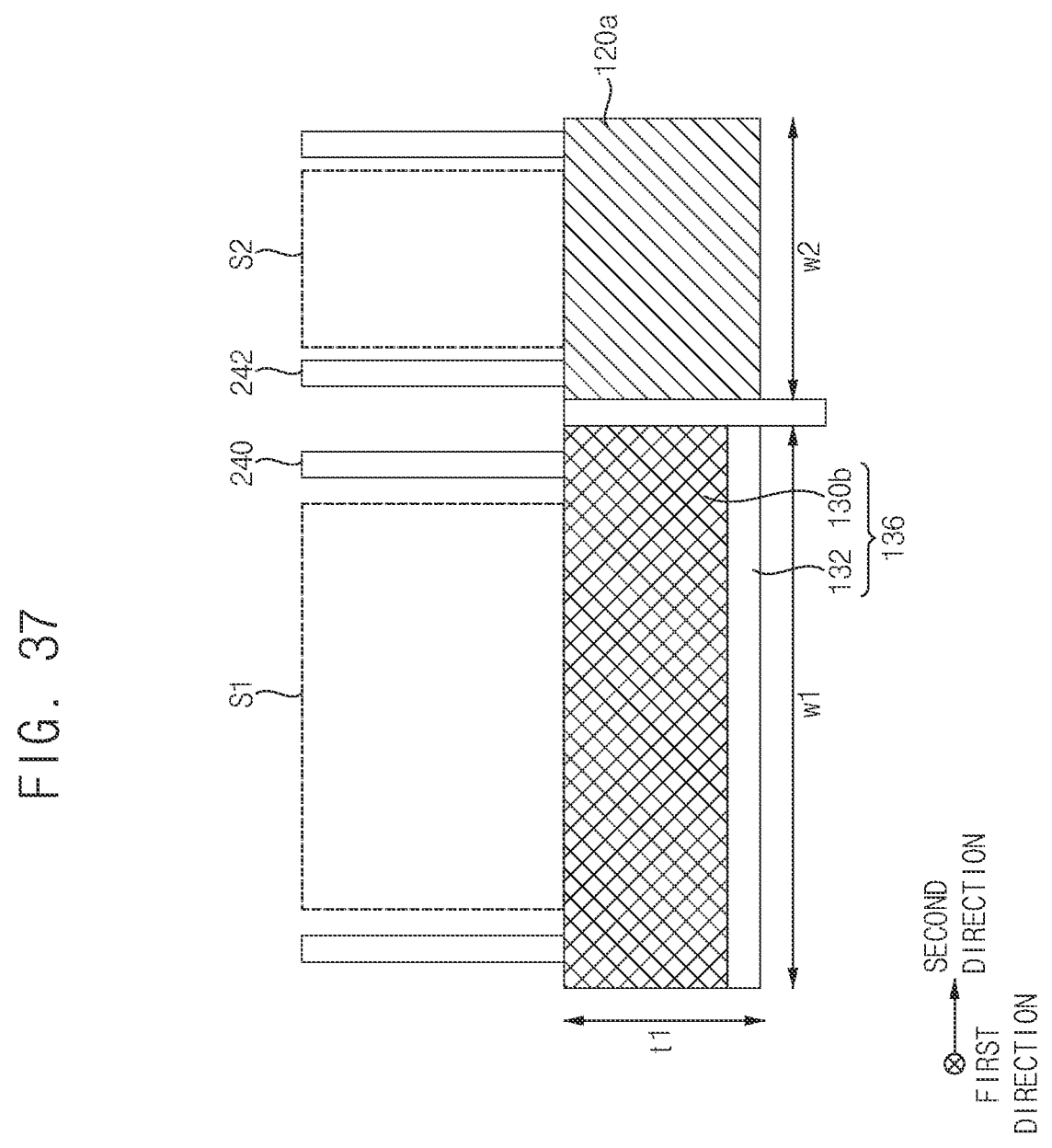

FIG. 37 is a cross-sectional view illustrating sub-semiconductor patterns of a vertical memory device according to example embodiments.

Referring to FIG. 37, first and second regions may be included in the MAT region of the substrate.

The first region may have a first width W1 in the second direction. The second region may have a second width W2 in the second direction that is less than the first width W1 in the second direction.

A first sub-semiconductor structure 136a including a lower conductive pattern 132 and a first sub-semiconductor pattern 130b may be formed on the first region. The lower conductive pattern 132 may include a material having a resistance lower than a resistance of a material of the first sub-semiconductor pattern 130b. The lower conductive pattern 132 may include metal.

A second sub-semiconductor pattern 120a may be formed on the second region. The first and second sub-semiconductor patterns 130b and 120a may include the same material.

Upper surfaces of the first sub-semiconductor structure 136a and the second sub-semiconductor pattern 120a may be coplanar with each other. In example embodiments, the first sub-semiconductor structure 136a and the second sub-semiconductor pattern 120a may have the same thickness.

Figure 38:
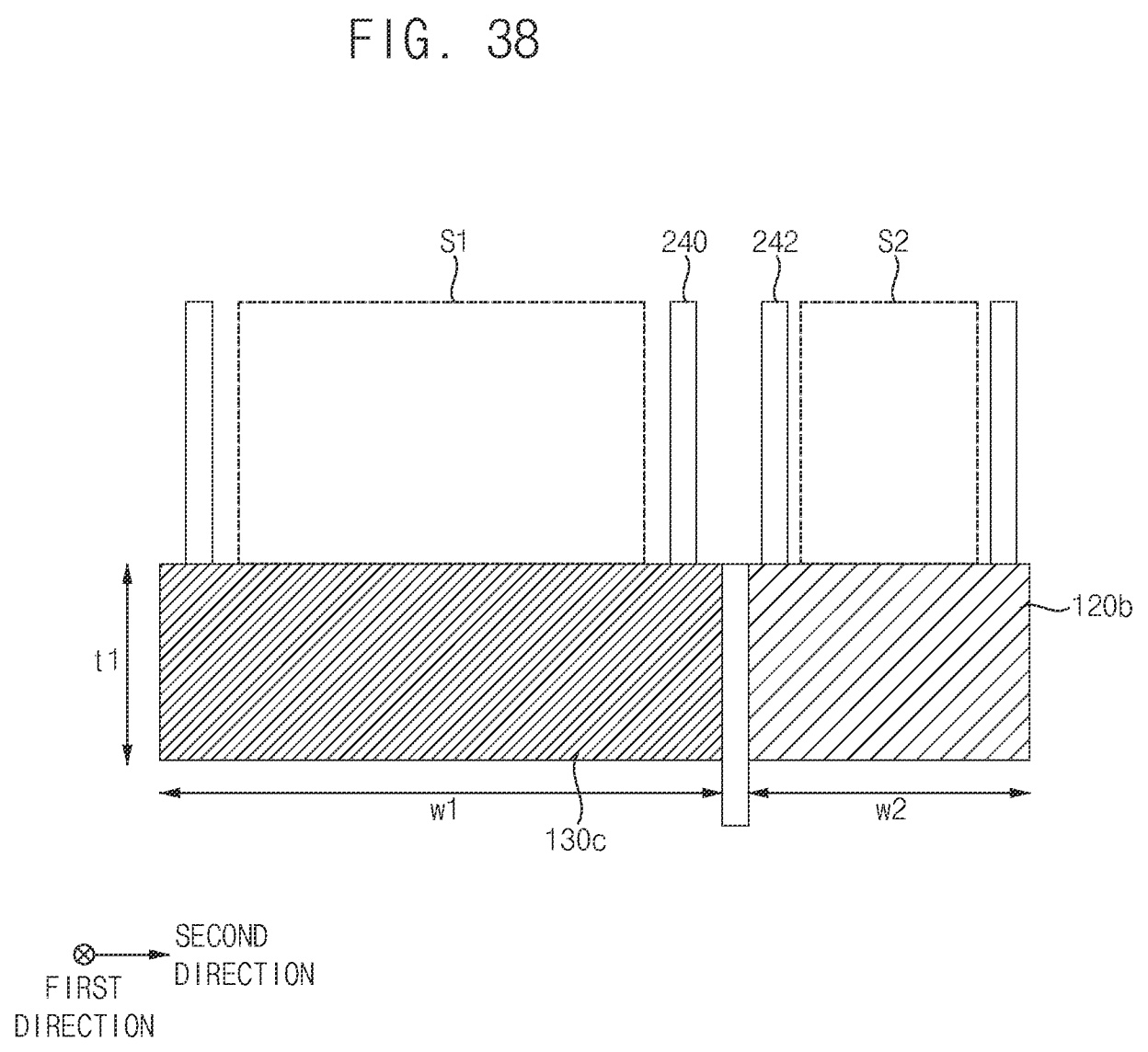

FIG. 38 is a cross-sectional view illustrating sub-semiconductor patterns in a vertical memory device according to example embodiments.

Referring to FIG. 38, first and second regions may be formed in the MAT region of the substrate.

The first region may have a first width W1 in the second direction. The second region may have a second width W2 in the second direction that is less than the first width W1 in the second direction.

A first sub-semiconductor pattern 130c may be formed on the first region, and a second sub-semiconductor pattern 120a may be formed on the second region.

The first sub-semiconductor pattern 130c may include polysilicon doped with N-type impurities having a first impurity concentration. The second sub-semiconductor pattern 120a may include polysilicon doped with N-type impurities having a second impurity concentration lower than the first impurity concentration.

Upper surfaces of the first sub-semiconductor pattern 130c and the second sub-semiconductor pattern 120a may be coplanar with each other. In example embodiments, the first sub-semiconductor pattern 130c and the second sub-semiconductor pattern 120a may have the same thickness.

Each of the above example embodiments may be applied to a bonding type vertical memory device. That is, thicknesses and stacked structures of the first and second sub-semiconductor patterns may be changed so that the first and second sub-semiconductor patterns may have target resistances in each of regions in the MAT region.

Figure 39A:
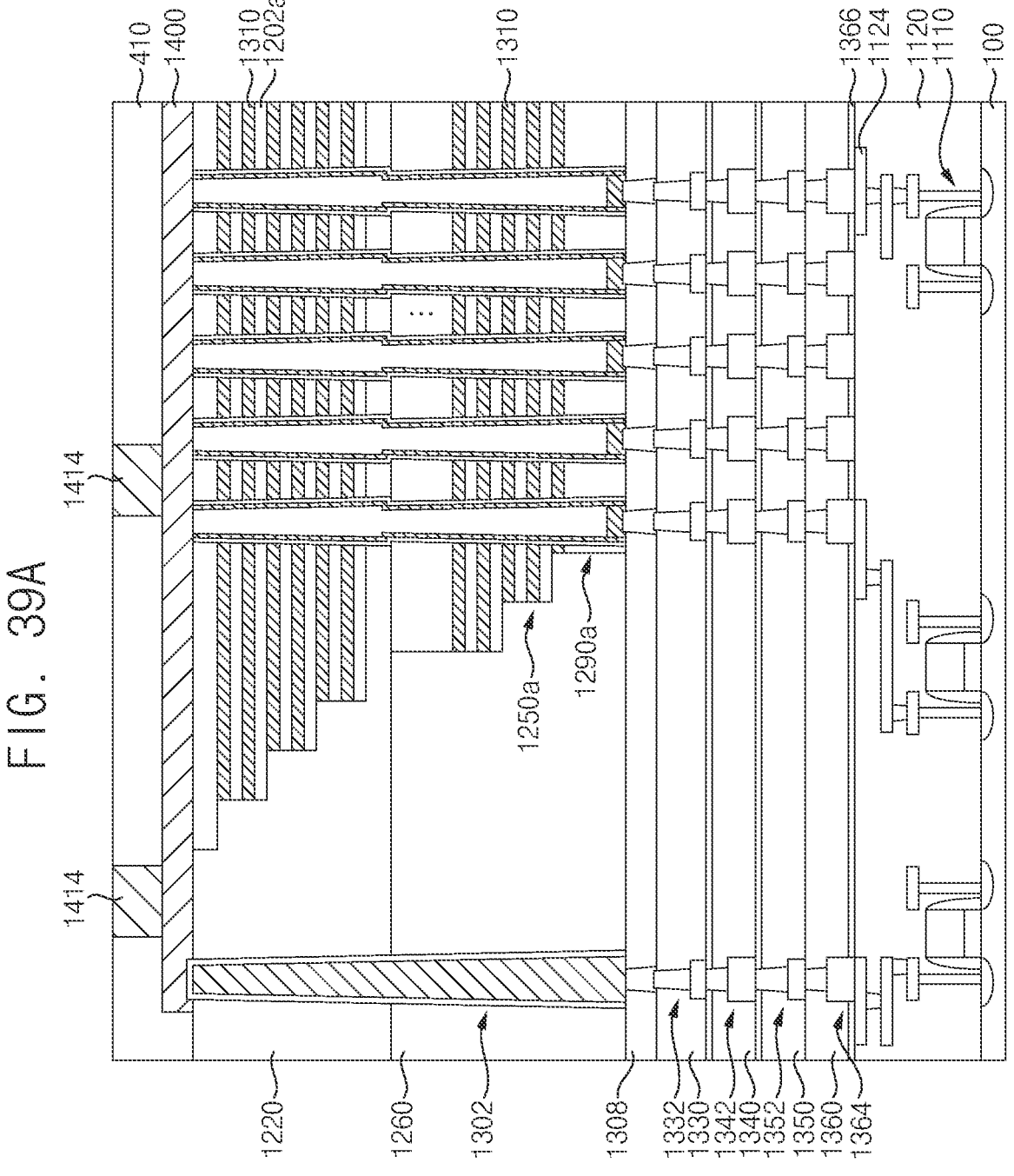
FIGS. 39A and 39B are cross-sectional views illustrating a bonding type vertical memory device according to example embodiments.
Figure 39B:
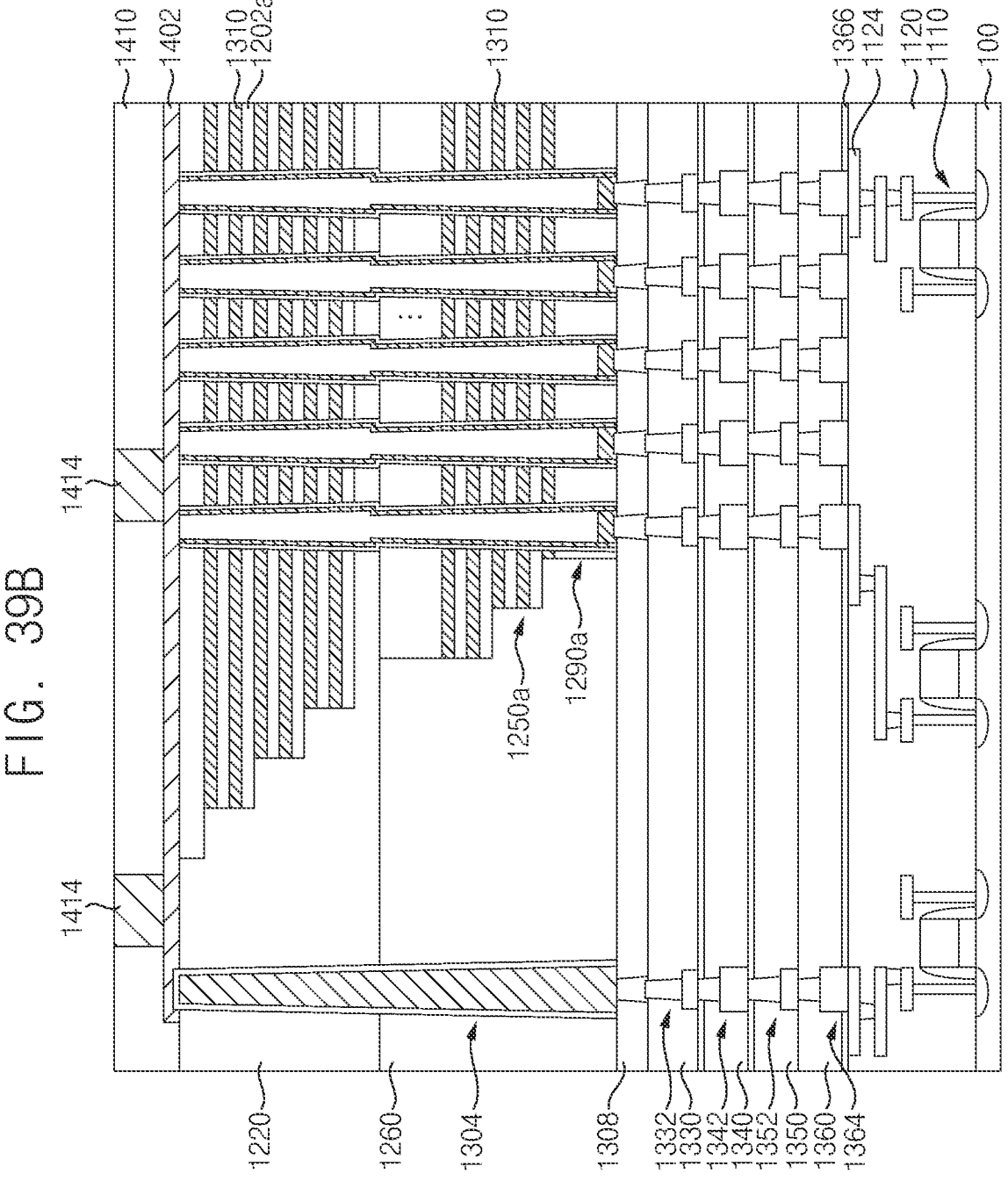

FIGS. 39A and 39B are cross-sectional views illustrating a bonding type vertical memory device according to example embodiments.

FIG. 39A illustrates first memory cells formed on a first sub-semiconductor pattern in a first region having a first width in the second direction. FIG. 39B illustrates second memory cells formed on a second sub-semiconductor pattern in a second region having a second width less than the first width in a second direction.

FIGS. 39A and 39B, a lower circuit pattern 1110 may be formed on the first and second regions of the substrate 100. A lower insulating interlayer 1120 may be formed to cover the lower circuit pattern 1110. A first bonding pattern 1124 may be formed on the lower insulating interlayer 1120. The first bonding pattern 1124 may include metal. The first bonding pattern 1124 may include, e.g., copper or aluminum.

A pattern structure 1250a in which insulation patterns 1202a and gate patterns 1310 are alternately and repeatedly stacked in a vertical direction perpendicular to an upper surface of the substrate may be formed on the lower insulating interlayer 1120. An edge of the pattern structure 1250a may have an inverted stair shape.

Insulating interlayers 1220, 1260, 1308, 1330, 1340, 1350 and 1360 may be formed on the lower insulating interlayer 1120 to cover the pattern structure 1250a. In example embodiments, as shown, first to seventh insulating interlayers 1220, 1260, 1308, 1330, 1340, 1350 and 1360 may be formed.

A second bonding pattern 1364 may be formed on a lower surface of the seventh insulating interlayer 1360. The second bonding pattern 1364 may include metal. The second bonding pattern 1364 may include, e.g., copper or aluminum. At least a portion of the first bonding pattern 1124 may be aligned with the second bonding pattern 1364 in the vertical direction.

The lower insulating interlayer 1120 and the lowermost insulating interlayer (e.g., the seventh insulating interlayer) may be bonded to each other. Also, the first bonding pattern 1124 and corresponding second bonding pattern 1364 may contact each other.

A bonding layer 1366 may be further formed between the lower insulating interlayer 120 and the seventh insulating interlayer 360. The bonding layer 1366 may be interposed between the lower insulating interlayer 1120 and the seventh insulating interlayer 1360 to bond the lower insulating interlayer 1120 and the seventh insulating interlayer 1360 to each other. The bonding layer 1366 may include, e.g., SiCN.

Channel holes may pass through the pattern structure 1250a in the vertical direction. A channel structure 1290a may be formed in the channel holes.

Wirings electrically connected to the channel structure 1290a may be included in the insulating interlayers. In example embodiments, first to third wirings 1332, 1342 and 1352 may be formed in the insulating interlayers.

First common source contacts 1302 may pass through the insulating interlayers on the first region. Second common source contacts 1304 may pass through the insulating interlayers on the second region. Each of the first and second common source contacts 1302 and 1304 may be spaced apart from the pattern structure 1250a.

The first common source contacts 1302 may be formed on edges of the first region in the second direction. The second common source contacts 1304 may be formed on edges of the second region in the second direction. The first and second common source contacts 1302 and 1304 may be electrically connected to the lower circuit patterns 1110 through wirings.

A first sub-semiconductor pattern 1400 may be formed on a surface of the pattern structure 1250a and on the first common source contact 1302 in the first region. The first sub-semiconductor pattern 1400 may cover the first region. The first sub-semiconductor pattern 1400 may be electrically connected to the channel of the channel structure 1290*a*.

A second sub-semiconductor pattern 1402 may be formed on a surface of the pattern structure 1250*a* and on the second common source contact 1304 in the second region. The second sub-semiconductor pattern may cover the second region. The second sub-semiconductor pattern 1400 may be electrically connected to the channel of the channel structure 1290*a*.

The first sub-semiconductor pattern 1400 may contact the channel included in the channel structure 290*a* and the first common source contact 1302, respectively. The second sub-semiconductor pattern 1402 may contact the channel included in the channel structure 290*a* and the second common source contact 1304, respectively.

In example embodiments, the first and second sub-semiconductor patterns 1400 and 1402 may include polysilicon doped with N-type impurities.

The first sub-semiconductor pattern 1400 may have a first thickness. The second sub-semiconductor pattern 1402 may have a second thickness less than the first thickness.

An upper insulating interlayer may be formed to cover the first insulating interlayer 1220, the first sub-semiconductor pattern 1400, the first common source contact 1302, the second sub-semiconductor pattern 1402 and the second common source contact 1304.

A contact plug 1414 connected to the first sub-semiconductor pattern 1400 and a contact plug 1414 connected to the second sub-semiconductor pattern 1402 may be formed through the upper insulating interlayer 1410, respectively.

While various example embodiments have been shown and described with reference to the drawings, it will be understood by those of ordinary skill in the art that various changes in form and details may be made thereto without departing from the spirit and scope of the present disclosure as set forth by the following claims.

What is claimed is:

1. A vertical memory device comprising:
a substrate including a first region and a second region having a same length as the first region in a first direction, the first region having a first width in a second direction perpendicular to the first direction, and the second region having a second width in the second direction that is less than the first width;
a first sub-semiconductor pattern covering the first region, the first sub-semiconductor pattern being spaced apart from an upper surface of the substrate, and at least a portion of the first sub-semiconductor pattern having a first thickness;
a second sub-semiconductor pattern covering the second region, the second sub-semiconductor pattern being spaced apart from the upper surface of the substrate, and the second sub-semiconductor pattern having a second thickness that is less than the first thickness;
a plurality of first common source contacts disposed on edges in the second direction of the first sub-semiconductor pattern;
a plurality of second common source contacts disposed on edges in the second direction of the second sub-semiconductor pattern;
a plurality of first cell structures on the first sub-semiconductor pattern; and
a plurality of second cell structures on the second sub-semiconductor pattern.

2. The vertical memory device of claim 1, wherein the first sub-semiconductor pattern has a first sheet resistance, and the second sub-semiconductor pattern has a second sheet resistance that is greater than the first sheet resistance.

3. The vertical memory device of claim 1, wherein each of the first sub-semiconductor pattern and the second sub-semiconductor pattern includes polysilicon doped with impurities.

4. The vertical memory device of claim 3, wherein the first sub-semiconductor pattern includes polysilicon doped with impurities having a first impurity concentration, and the second sub-semiconductor pattern includes polysilicon doped with impurities having a second impurity concentration, and
wherein the first impurity concentration is equal to the second impurity concentration.

5. The vertical memory device of claim 3, wherein the first sub-semiconductor pattern includes polysilicon doped with impurities having a first impurity concentration, and the second sub-semiconductor pattern includes polysilicon doped with impurities having a second impurity concentration, and
wherein the second impurity concentration is less than the first impurity concentration.

6. The vertical memory device of claim 1, wherein an upper surface of the first sub-semiconductor pattern is coplanar with an upper surface of the second sub-semiconductor pattern, and
wherein the upper surface of the first sub-semiconductor pattern and the upper surface of the second sub-semiconductor pattern are substantially flat.

7. The vertical memory device of claim 1, wherein the first sub-semiconductor pattern has the first thickness over an entirety of the first region.

8. The vertical memory device of claim 1, wherein a first portion of the first sub-semiconductor pattern has the first thickness, and a second portion of the first sub-semiconductor pattern has the second thickness.

9. The vertical memory device of claim 1, wherein the first sub-semiconductor pattern has a structure in which a lower conductive pattern and a semiconductor pattern are stacked, and the lower conductive pattern contacts a bottom of the semiconductor pattern.

10. The vertical memory device of claim 9, wherein the semiconductor pattern includes a material that is the same as a material of the second sub-semiconductor pattern, and
wherein a material of the lower conductive pattern has a resistance less than a resistance of the material of the semiconductor pattern.

11. A vertical memory device comprising:
a substrate including a first region and a second region having a same length as the first region in a first direction, the first region having a first width in a second direction perpendicular to the first direction, and the second region having a second width in the second direction that is less than the first width;
a first sub-semiconductor pattern covering the first region, the first sub-semiconductor pattern being spaced apart from an upper surface of the substrate, and the first sub-semiconductor pattern having a first sheet resistance;
a second sub-semiconductor pattern covering the second region, the second sub-semiconductor pattern being spaced apart from the upper surface of the substrate, and the second sub-semiconductor pattern having a second sheet resistance that is greater than the first sheet resistance;

a plurality of first common source contacts disposed on edges in the second direction of the first sub-semiconductor pattern;

a plurality of second common source contacts disposed on edges in the second direction of the second sub-semiconductor pattern;

a plurality of first cell structures on the first sub-semiconductor pattern; and a plurality of second cell structures on the second sub-semiconductor pattern.

12. The vertical memory device of claim 11, wherein at least a portion of the first sub-semiconductor pattern has a first thickness, and the second sub-semiconductor pattern has a second thickness that is less than the first thickness.

13. The vertical memory device of claim 12, wherein the first sub-semiconductor pattern has two or more thicknesses at corresponding positions thereof, and the two or more thicknesses of the first sub-semiconductor pattern are equal to or greater than the second thickness.

14. The vertical memory device of claim 11, wherein each of the first sub-semiconductor pattern and the second sub-semiconductor pattern includes polysilicon doped with impurities.

15. The vertical memory device of claim 14, wherein the first sub-semiconductor pattern includes polysilicon doped with impurities having a first impurity concentration, and the second sub-semiconductor pattern includes polysilicon doped with impurities having a second impurity concentration that is less than the first impurity concentration.

16. The vertical memory device of claim 11, wherein first sub-semiconductor pattern has a structure in which a lower conductive pattern and a semiconductor pattern are stacked, and the lower conductive pattern includes a metal having a resistance that is less than a resistance of a material of the semiconductor pattern.

17. The vertical memory device of claim 11, wherein an upper surface of the first sub-semiconductor pattern is coplanar with an upper surface of the second sub-semiconductor pattern, and wherein the upper surface of the first sub-semiconductor pattern and the upper surface of the second sub-semiconductor pattern are substantially flat.

18. A vertical memory device comprising:

a substrate including a first region and a second region having a same length as the first region in a first direction, the first region having a first width in a second direction perpendicular to the first direction, and the second region having a second width in the second direction that is less than the first width;

a plurality of circuit patterns on the substrate;

a lower insulating interlayer covering the first region, the second region, and the plurality of circuit patterns;

a first sub-semiconductor pattern on the lower insulating interlayer of the first region, and the first sub-semiconductor pattern covering the first region;

a second sub-semiconductor pattern on the lower insulating interlayer of the first region, the second sub-semiconductor pattern covering the second region, and the second sub-semiconductor pattern having a second thickness different from a first thickness of the first sub-semiconductor pattern;

a plurality of first common source contacts disposed on edges in the second direction of the first sub-semiconductor pattern, the plurality of first common source contacts applying electrical signals to the first sub-semiconductor pattern;

a plurality of second common source contacts disposed on edges in the second direction of the second sub-semiconductor pattern, the plurality of second common source contacts applying electrical signals to the second sub-semiconductor pattern;

a plurality of first cell structures on the first sub-semiconductor pattern, the plurality of first cell structures being electrically connected to the first sub-semiconductor pattern; and a plurality of second cell structures on the second sub-semiconductor pattern, the plurality of second cell structures being electrically connected to the second sub-semiconductor pattern, wherein an upper surface of the first sub-semiconductor pattern is coplanar with an upper surface of the second sub-semiconductor pattern, and wherein the upper surface of the first sub-semiconductor pattern and the upper surface of the second sub-semiconductor pattern are substantially flat.

19. The vertical memory device of claim 18, wherein each of the plurality of first cell structures and each of the plurality of second cell structures includes:

a pattern structure in which a first insulation layer and a gate pattern are alternately and repeatedly stacked, and an edge in the first direction of the pattern structure having a stepped shape; and a channel structure passing through the pattern structure, and extending to an inner portion of each of the first sub-semiconductor pattern and the second sub-semiconductor pattern.

20. The vertical memory device of claim 18, wherein a portion of the first sub-semiconductor pattern has the first thickness that is greater than the second thickness of the second sub-semiconductor pattern, and wherein the first sub-semiconductor pattern has two or more thicknesses at corresponding positions thereof, and the two or more thicknesses of the first sub-semiconductor pattern are equal to or greater than the second thickness.

* * * * *